(12) United States Patent
Conte

(10) Patent No.: US 10,796,758 B2
(45) Date of Patent: Oct. 6, 2020

(54) NON-VOLATILE MEMORY DEVICE WITH SWITCHABLE READING MODE AND RELATED READING METHOD

(71) Applicant: STMicroelectronics S.r.l., Agrate Brianza (MB) (IT)

(72) Inventor: Antonino Conte, Tremestieri Etneo (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/299,226

(22) Filed: Mar. 12, 2019

(65) Prior Publication Data

US 2019/0295641 A1    Sep. 26, 2019

(30) Foreign Application Priority Data

Mar. 20, 2018   (IT) ........................ 102018000003796

(51) Int. Cl.
| | |
|---|---|
| G11C 13/00 | (2006.01) |
| G06F 13/16 | (2006.01) |
| G11C 7/06 | (2006.01) |
| G11C 7/08 | (2006.01) |

(52) U.S. Cl.
CPC ........ *G11C 13/004* (2013.01); *G06F 13/1668* (2013.01); *G11C 7/065* (2013.01); *G11C 7/08* (2013.01); *G11C 13/003* (2013.01); *G11C 13/0004* (2013.01); *G11C 13/0026* (2013.01); *G11C 13/0028* (2013.01); *G11C 13/0038* (2013.01); *G11C 2013/0042* (2013.01); *G11C 2013/0054* (2013.01); *G11C 2207/2281* (2013.01); *G11C 2213/79* (2013.01)

(58) Field of Classification Search
None
See application file for complete search history.

(56) References Cited

U.S. PATENT DOCUMENTS

| | | | |
|---|---|---|---|
| 9,036,405 B1 | 5/2015 | Giridhar et al. | |
| 2010/0080039 A1* | 4/2010 | Choi ................. | G11C 13/0004 365/148 |
| 2019/0096480 A1 | 3/2019 | Conte | |

FOREIGN PATENT DOCUMENTS

| | | |
|---|---|---|
| EP | 0828252 A2 | 3/1998 |
| WO | 2015136740 A1 | 9/2015 |

* cited by examiner

*Primary Examiner* — James G Norman
(74) *Attorney, Agent, or Firm* — Slater Matsil, LLP

(57) ABSTRACT

Described herein is a non-volatile memory device in which it is possible to switch between different reading modes. In particular, the memory device includes a plurality of memory cells and implements, alternatively, a reading of a differential type and a reading of a single-ended type. Further described herein is a method for reading the memory device.

20 Claims, 23 Drawing Sheets

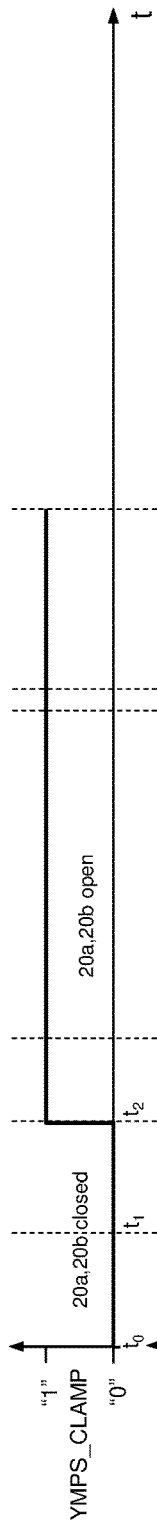
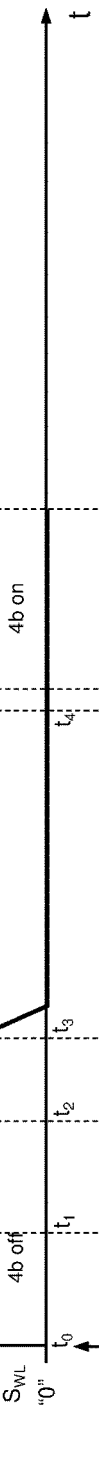
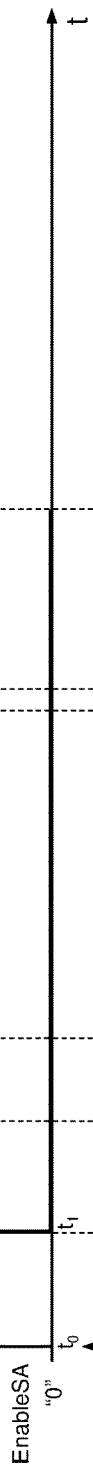
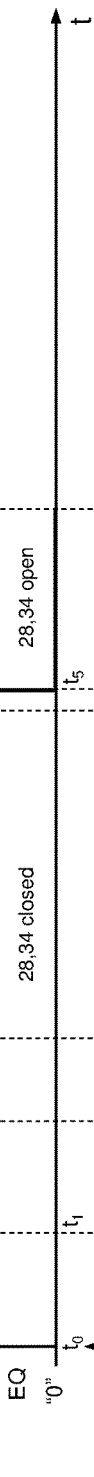
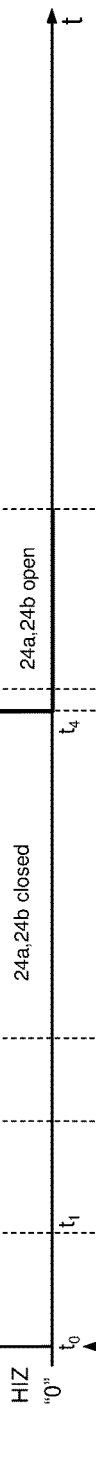
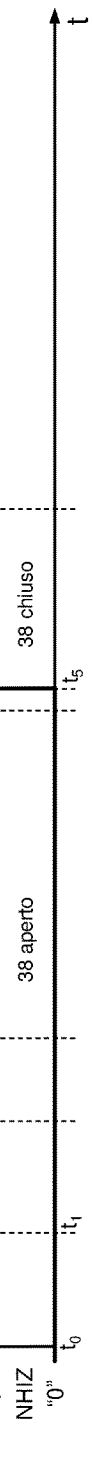

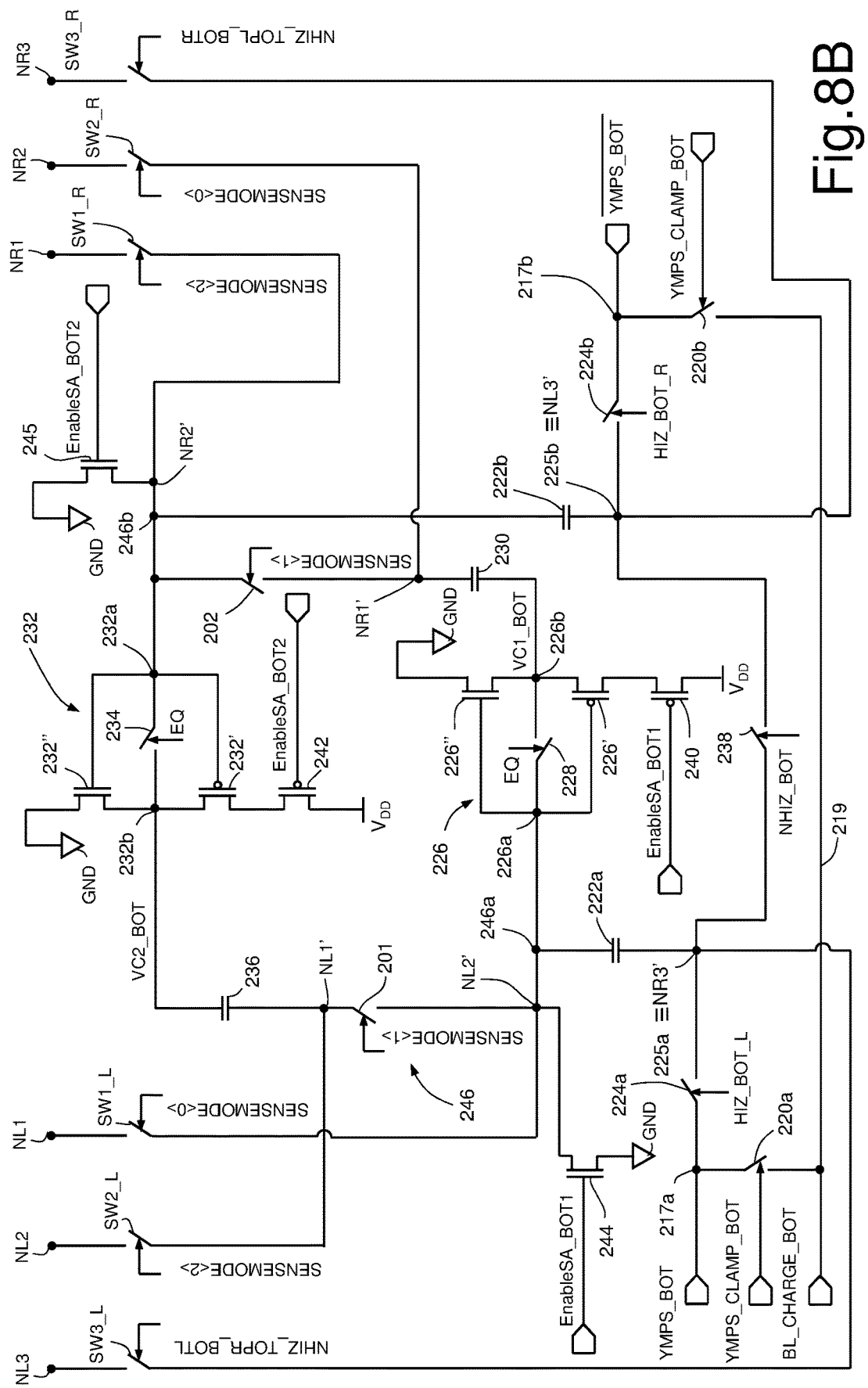

Fig.13A

| CONFIGURATION | OUTPUT SIGNALS | |
|---|---|---|
| TOP-TOP | VC1=VC1_TOP | VC2=VC2_TOP |
| BOT-BOT | VC1=VC1_BOT | VC2=VC2_BOT |
| TOPL-BOTR/ BOTR-TOPL | VC1=VC1_TOP | VC2=VC2_BOT |
| TOPR-BOTL/ BOTL-TOPR | VC1=VC1_BOT | VC2=VC2_BOT |

Fig.13B

| CONFIGURATION | SENSEMODE<2:0> | EnableSA_TOP1/ EnableSA_TOP2 | EnableSA_BOT1/ EnableSA_BOT2 | VERIFY_TOPL/ VERIFY_TOPR | VERIFY_BOTL/ VERIFY_BOTR | VERIFY_TOP/ VERIFY_BOT | NHIZ_TOP/ HIZ_TOP_R/ HIZ_TOP_L | NHIZ_BOT/ HIZ_BOT_R/ HIZ_BOT_L | NHIZ_TOPR_BOTL | NHIZ_TOPL_BOTR |
|---|---|---|---|---|---|---|---|---|---|---|
| TOP-TOP | 010 | SIGNAL/ SIGNAL | SIGNAL/ SIGNAL | 0/0 | 0/0 | 0/0 | SIGNAL/ SIGNAL/ SIGNAL | 0/1/1 | 0 | 0 |
| BOT-BOT | 010 | 1/1 | SIGNAL/ SIGNAL | 0/0 | 0/0 | 0/0 | 0/1/1 | SIGNAL/ SIGNAL/ SIGNAL | 0 | 0 |
| TOPL-BOTR | 100 | SIGNAL/1 | 1/SIGNAL | 0/0 | 0/1 | 0/SIGNAL | 0/0/SIGNAL | 0/SIGNAL/0 | 0 | SIGNAL |
| BOTR-TOPL | 100 | SIGNAL/1 | 1/SIGNAL | 1/0 | 0/0 | SIGNAL/0 | 0/0/SIGNAL | 0/SIGNAL/0 | 0 | SIGNAL |
| TOPR-BOTL | 001 | 1/SIGNAL | SIGNAL/1 | 0/0 | 1/0 | SIGNAL/0 | 0/SIGNAL/0 | 0/0/SIGNAL | SIGNAL | 0 |
| BOTL-TOPR | 001 | 1/SIGNAL | SIGNAL/1 | 0/1 | 0/0 | 0/SIGNAL | 0/SIGNAL/0 | 0/0/SIGNAL | SIGNAL | 0 |

NON-VOLATILE MEMORY DEVICE WITH SWITCHABLE READING MODE AND RELATED READING METHOD

CROSS-REFERENCE TO RELATED APPLICATIONS

This application claims priority to Italian Patent Application No. 102018000003796, filed on Mar. 20, 2018, which application is hereby incorporated herein by reference.

TECHNICAL FIELD

The present disclosure relates to a non-volatile memory device in which it is possible to switch between different reading modes; further, the present disclosure relates to the method for reading the memory device.

BACKGROUND

Phase-Change Memories (PCMs) are a new generation of non-volatile memories in which, in order to store information, the characteristics of materials having the property of switching between phases with different electrical characteristics are exploited. These materials may switch between a disorderly/amorphous phase and an orderly, crystalline or polycrystalline, phase; different phases are characterized by different values of resistivity and are consequently associated to different values of a datum stored. For instance, it is possible to use elements of Group VI of the periodic table, such as tellurium (Te), selenium (Se), or antimony (Sb), referred to as "chalcogenides" or "chalcogenic materials", to produce phase-change memory elements. In particular, an alloy made up of germanium (Ge), antimony (Sb), and tellurium (Te), known as GST (having chemical composition Ge2Sb2Te5) currently finds wide use in such memory cells.

Phase change in a memory element may be obtained by locally increasing the temperature of the cells of chalcogenic material, through resistive electrodes (generally known as "heaters") arranged in contact with the regions of chalcogenic material.

Access (or selection) devices (for example, bipolar or MOS transistors) are connected to the heaters so as to enable selective passage of the programming electric current (also known as writing electric current) through them. This electric current, by the Joule effect, generates the temperatures required for phase change.

In particular, when the chalcogenic material is in the amorphous state, and thus has a high resistivity (the so-called RESET state), it is necessary to apply a current/voltage pulse (or a suitable number of current/voltage pulses) of a duration and amplitude such as to enable the chalcogenic material to cool slowly. Subjected to this treatment, the chalcogenic material changes state and switches from the high-resistivity state to a low-resistivity state (the so-called SET state). Conversely, when the chalcogenic material is in the SET state, it is necessary to apply a current/voltage pulse having an appropriate duration and a large amplitude so as to cause the chalcogenic material to return into the high-resistivity amorphous RESET state.

During reading, the state of the chalcogenic material is detected by applying a voltage sufficiently low as not to cause sensible heating thereof, and then reading the value of the current flowing in the memory cell through a sense amplifier. Given that the current is proportional to the conductivity of the chalcogenic material, it is possible to determine in which state the material is, and consequently determine the datum stored in the memory cell.

An example of PCM device in which the selector elements are formed by bipolar transistors of a PNP type is described in the Italian patent application No. 102017000108905, filed on Sep. 28, 2017 in the name of the present applicant, and is illustrated in FIG. 1, where it is designated by 1.

In particular, the PCM device 1 includes a memory array 2 formed by a plurality of memory cells 3, arranged in rows, or wordlines WL, and columns, or bitlines BL. Purely by way of example, illustrated in FIG. 1 are three wordlines, designated by WL, and three bitlines, designated by BL, which enable nine memory cells 3 to be addressed.

Each memory cell 3 is formed by a storage element 4a and by a selector element 4b, which are connected in series between a respective bitline BL and a reference-potential terminal (for example, ground, abbreviated GND).

The storage element 4a includes an element of phase-change material (for example, a chalcogenide, such as GST) and is consequently able to store data in the form of resistance levels associated to the different phases assumed by the material itself.

The selector element 4b is formed by a bipolar junction transistor (BJT) of a PNP type, the emitter terminal of which is connected to a first terminal of the storage element 4a, whereas the base terminal is connected to a corresponding wordline WL; the collector terminal of the bipolar transistor is connected to ground. In this regard, one wordline WL is connected to all the base terminals of the bipolar transistors 4b aligned along the same row; likewise, one bitline BL is connected to all the second terminals of the storage elements 4a aligned along the same column.

In practice, given a memory cell 3, the second terminal of the storage element 4a and the base terminal of the bipolar transistor 4b form, respectively, a bitline terminal and a wordline terminal of the memory cell 3.

The PCM device 1 further includes a column decoder 8 and a row decoder 10, which enable selection of the memory cells 3, on the basis of address signals received at input (designated as a whole by AS). The address signals AS may be generated by a control logic CL, which further drives the column decoder 8 and the row decoder 10 so as to enable reading and writing (also known as programming) of the memory cells 3 addressed by the address signals AS. The control logic CL supplies to the column decoder 8 and to the row decoder 10 also control signals in order to govern the aforementioned read/write operations.

The column decoder 8 and the row decoder 10 enable biasing, and thus selection, of the wordlines WL and bitlines BL each time addressed so as to select the memory cells 3 connected thereto; in this way, reading and writing of the memory cells 3 are enabled.

In greater detail, the row decoder 10 is designed to select, on the basis of the address signals AS, a corresponding wordline WL. The other wordlines WL are said to be deselected. For this purpose, the row decoder 10 includes a decoder stage 4 and a plurality of driving circuits 6.

The decoder stage 4 receives the address signals AS and controls the driving circuits 6 as a function of the address signals AS. Each driving circuit 6 thus has an input, which is connected to the decoder stage 4. Each driving circuit 6 further has an output, which is connected to a corresponding wordline WL.

Each driving circuit 6 biases, and thus controls, the base terminals of the bipolar transistors 4b connected to the corresponding wordline WL so as to select/deselect the wordline WL as a function of the address signals AS.

As regards the column decoder 8, it selects, as a function of the address signals AS, one or more bitlines BL. In practice, the column decoder 8 co-operates with the row decoder 10 so that, during the steps of reading or programming of any memory cell 3 selected, a reading current or a programming current, respectively, flows through the storage element 4a of the memory cell 3.

In particular, the column decoder 8 is configured to implement internally two distinct paths towards the bitlines BL each time selected of the memory array 2: a reading path, which during the reading step electrically connects each bitline BL selected to a reading stage 17; and a programming path, which during the programming step electrically connects each bitline BL selected to a writing stage 18.

For this purpose, the column decoder 8 includes, for each reading and programming path, appropriate selection elements, in particular controlled transistors, connected in cascaded mode and configured to implement an address decoding (typically, of a hierarchical type) for selecting the memory cells 3.

As illustrated schematically in FIG. 2, the memory array 2 is usually arranged in a plurality of sectors S, each of which includes a plurality of memory cells 3. Each sector S includes a plurality of respective wordlines WL and respective local bitlines, designated once again by BL and distinguished from those of the other sectors, which are connected to the memory cells 3 of the memory array 2 present in the same sector S. In addition, for each set formed by a number k (for example, four) of local bitlines BL, a corresponding main bitline MBL is provided. The main bitlines MBL enable, when selected at a higher hierarchical level, subsequent selection, at a lower hierarchical level, of one or more of the respective local bitlines BL and of the corresponding memory cells 3. In general, the use of the adjective "local", when referred to a bitline or a wordline, emphasises that it belongs to a sector.

The main bitlines MBL traverse a certain number of sectors S and may be selected in sets at a hierarchical decoding level even higher than the one associated to selection of the main bitlines MBL.

The column decoder 8 consequently includes: for each sector S, at least one respective first-level decoder circuit (designated by 11 in FIG. 2), which enables connection of the local bitlines BL to the respective main bitlines MBL, both during the programming operations and during the reading operations; and for each set of sectors S (formed, in the example of FIG. 2, by two sectors), a respective second-level decoder circuit (designated by 114), which enables selection of the main bitlines MBL both during the programming operations and during the reading operations.

Typically, decoder circuits for PCMs with BJT selectors are provided with P-channel CMOS transistors.

This having been said, for reasons of simplicity, in what follows by "first-level decoder circuits" and "second-level decoder circuits" are meant the related reading circuits. In other words, reference is made to a scheme of the type illustrated in FIG. 3, where the first-level decoder circuits are designated by 11, whereas the second-level decoder circuit is designated by 114.

Once again with reference to FIG. 3, this shows how the control logic CL sends to the second-level decoder circuit 114 main-column-decoding signals YN<i>, on the basis of which the second-level decoder circuit 114 activates an electrical path between a main bitline (here designated by MBL<i>) selected and a sense amplifier 46 of the reading stage 17, by activation of a respective main selection switch, described hereinafter. In this connection, the reading stage 17 includes a plurality of sense amplifiers, even though hereinafter reference is made to just the sense amplifier 46.

As mentioned previously, FIG. 3 further shows how, given each sector S, each main bitline MBL<i> is associated, i.e., it may be electrically coupled, to a corresponding set of local bitlines (here designated by BL<i,j>). Further, given a sector S, the corresponding first-level decoder circuit 11 is able to address each memory cell coupled to a local bitline BL<i,j> thanks to the presence of local-selection switches, which are driven by respective local-column-decoding signals YO<i,j> generated by the control logic CL.

The PCM device 1 implements a differential reading scheme. In other words, the memory array 2 is operatively divided into pairs of memory cells 3, which are written so that, when a cell of the pair is in the SET/RESET state, the other cell is in the RESET/SET state. In addition, reading of the memory array 2 is carried out in pairs. In particular, the reading stage 17 is configured to compare the reading currents that circulate in a corresponding pair of memory cells 3. The cells of the pair, also referred to as complementary cells, are arranged in a same row (wordline). Likewise, the writing stage 18 is configured to supply appropriate programming currents to corresponding pairs of memory cells 3 so as to program the memory cells 3 of each pair in opposite states.

In greater detail, when a memory cell 3 is selected, the base terminal of its bipolar transistor 4b is set at an approximately zero voltage. Instead, when a memory cell 3 is not selected, the base terminal of its bipolar transistor 4b is set at a positive voltage. Further, in the case where the RESET state is programmed, a voltage drop typically included between 1.1 and 2.1 V is present on the storage element 4a; in the case where the SET state is programmed, a voltage drop typically included between 1.1 V and 1.7 V is present on the storage element 4a; again, in the case where a reading operation is carried out, a voltage drop of approximately 0.4 V is present on the storage element 4a. In general, the voltage present on the second terminal of the storage element 4a, and thus the voltage that it is necessary to impose on the corresponding bitline BL, depends upon the characteristic parameters of the bipolar transistors 4b.

As illustrated in greater detail in FIG. 4, which refers to a portion of a first sector S', the memory array 2 includes a plurality of first memory cells 3' (just one of which is illustrated in FIG. 4) and a plurality of second memory cells 3" (just one of which is illustrated in FIG. 4), which correspond, as regards number and characteristics of fabrication, to the first memory cells 3' and store logic data complementary to the logic data stored in the corresponding first memory cells 3'. In particular, the first and second memory cells 3', 3" are identical to one another. In addition, each memory cell is coupled to a corresponding bitline capacitor 4c, which represents the parasitic capacitance of the respective local bitline (denoted, respectively, by $BL_L$<j>, in the case of a first memory cell 3', and by $BL_R$<j>, in the case of a second memory cell 3") and is connected in parallel to the series of the corresponding storage element 4a and of the corresponding selector element 4b. Furthermore, pairs formed by first memory cells 3' and by the corresponding second memory cells 3" are read in differential mode.

In greater detail, FIG. 4 shows just one pair of complementary cells, and thus, as mentioned previously, just one first memory cell 3' and just one second memory cell 3", which are electrically coupled to a corresponding local wordline WL, in addition to the respective local bitlines.

In use, the column decoder 8 receives at input first local-column-decoding signals $YO_L<j>$ (generated by the control logic CL) for selection of a respective local bitline $BL_L<j>$, where j is an integer that may range between 1 and k (where k is, as mentioned previously, the number of local bitlines that may be coupled to a corresponding main bitline) in order to access a corresponding memory cell 3'. Further, the column decoder 8 receives second local-column-decoding signals $YO_R<j>$ (generated by the control logic CL) for selection of a respective local bitline $BL_R<j>$ in order to access a corresponding memory cell 3".

In greater detail, the column decoder 8 is configured to enable part of a current path between the bitline selected $BL_L<j>$ and a first input 17a of the reading stage 17 by closing a local-selection switch 13a arranged between a node A common to all the corresponding k local bitlines $BL_L<i,j>$ and the bitline selected $BL_L<j>$, and so as to enable part of a current path between the bitline selected $BL_R<j>$ and a second input 17b of the reading stage 17 by closing a local-selection switch 13b arranged between a node B common to all the corresponding k local bitlines $BL_R<i,j>$ and the bitline selected $BL_R<j>$.

In particular, the local-column-decoding signals $YO_L<j>$, $YO_R<j>$ drive, respectively, the local-selection switches 13a and 13b. In addition, corresponding to each local bitline $BL_L<j>$ is a respective local-selection switch 13a, whereas corresponding to each local bitline $BL_R<j>$ is a respective local-selection switch 13b.

In what follows, for simplicity of description, reference will always be made, except where otherwise specified, to the first and second memory cells 3', 3" illustrated in FIG. 4 and to the corresponding local bitlines. Furthermore, the signals that control the local-selection switch 13a and the local-selection switch 13b coupled, respectively, to the first and second memory cells 3', 3" will be referred to as local-column-decoding signals $YO_L$, $YO_R$.

A first main bitline (denoted by $MBL_L$ in FIG. 4) extends between the node A and ground, thus forming a main-bitline parasitic capacitor 9' having a capacitance $C_{MBL}$, for example included between 30 fF and 120 fF. The node A is coupled to the first input 17a of the reading stage 17 by interposition of a corresponding main selection switch 12a. The node A is likewise coupled to a charge line 19 by interposition of a corresponding precharge switch 14a.

As described more fully in what follows, during an operation of reading of the first memory cell 3', the precharge switch 14a is controlled in order to precharge the main-line parasitic capacitor 9' at the voltage value BL_CHARGE of the charge line 19, for example chosen between 1.5 V and 1.8 V. Further, a main-column-decoding signal $YN_L<i>$ is supplied by the control logic CL to the column decoder 8 in order to control the main selection switch 12a.

A second main bitline $MBL_R$ extends between the node B and ground, thus forming a main-bitline parasitic capacitor 9", which has a capacitance substantially equal to the aforementioned capacitance $C_{MBL}$. In this connection, the first and second main bitlines $MBL_L$, $MBL_R$ may have the same size and may be arranged symmetrically with respect to the reading stage 17. More precisely, the first and second main bitlines $MBL_L$, $MBL_R$ are parallel to one another and arranged aligned in a direction perpendicular to them.

The node B is coupled to the second input 17b of the reading stage 17 by interposition of a corresponding main selection switch 12b. The node B is likewise coupled to the charge line 19 by interposition of a corresponding precharge switch 14b. As described more fully in what follows, during an operation of reading of the second memory cell 3", the precharge switch 14b is driven in order to precharge the main-bitline capacitor 9" at the voltage value of the charge line 19. Further, a main-column-decoding signal $YN_R<i>$ is supplied by the control logic CL to the column decoder 8 in order to control the main selection switch 12b.

In what follows, for reasons of brevity reference the signals $YN_L<i>$ and $YN_R<i>$ that control, respectively, the main-selection switches 12a, 12b illustrated in FIG. 4 will be referred to as main-column-decoding signals $YN_L$, $YN_R$.

The column decoder 8 thus includes two distinct read-decoder circuits, and in particular a first read-decoder block 8a and a second read-decoder block 8b, designed to implement, respectively: (i) a current path between the first memory cell 3' and the first input 17a of the reading stage 17, and (ii) a current path between the second memory cell 3" and the second input 17b of the reading stage 17. The current paths thus generated are thus distinct and separate from one another. In addition, the first read-decoder block 8a and the second read-decoder block 8b have a specular structure.

The PCM device 1 further includes a charge pump 39 (illustrated in FIG. 3), connected to the supply line 19 and coupled to the second-level decoder circuit 114. In an idle state of the PCM device 1, the main bitlines MBL<i> are supplied with a positive voltage, for example included between 1.5 V and 1.8 V, supplied by the charge pump 39.

Once again with reference to FIG. 4, the selection switches 12a, 12b, 13a, 13b are implemented by MOS transistors, the gate terminals of which receive the aforementioned column-decoding signals $YN_L$, $YN_R$, $YO_L$, $YO_R$, i.e., logic signals having voltage values included between 0 V and at least the voltage value of the charge line 19 (the voltage swing of the aforesaid signals may even be higher than that of the charge line 19).

The charge line 19 may be electrically connected to the first and second inputs 17a, 17b of the reading stage 17 via respective voltage-clamp switches 20a, 20b, which may be controlled via a voltage-clamp signal YMPS_CLAMP generated by the control logic CL.

The sense amplifier 46 includes a first input 46a electrically coupled to the first input 17a of the reading stage 17 via the series of a first coupling capacitor 22a, which has two conduction terminals, and a first coupling switch 24a, which also has two conduction terminals. In particular, one terminal of the first coupling capacitor 22a forms the first input 46a of the sense amplifier 46, whereas one terminal of the first coupling switch 24a forms the first input 17a of the reading stage 17. Further, the other terminal of the first coupling capacitor 22a is connected to the other terminal of the first coupling switch 24a at a common node 25a.

The sense amplifier 46 includes a second input 46b, electrically coupled to the second input 17b of the reading stage 17 via the series of a second coupling capacitor 22b, which has two conduction terminals, and a second coupling switch 24b, which also has two conduction terminals. In particular, one terminal of the second coupling capacitor 22b forms the second input 46b of the sense amplifier 46, whereas one terminal of the second coupling switch 24b forms the second input 17b of the reading stage 17. Further, the other terminal of the second coupling capacitor 22b is connected to the other terminal of the second coupling switch 24b at a common node 25b.

The sense amplifier 46 further includes a first inverter 26, having an input terminal 26a and an output terminal 26b, and a first equilibrium switch 28, connected between the input terminal 26a and the output terminal 26b of the first inverter 26. A first compensation capacitor 30 is connected between the output terminal 26b of the first inverter 26 and the second input 46b of the sense amplifier 46. The input terminal 26a of the first inverter 26 is connected to the first input 46a of the sense amplifier 46.

The sense amplifier 46 further includes a second inverter 32, having an input terminal 32a and an output terminal 32b, and a second equilibrium switch 34, connected between the input terminal 32a and the output terminal 32b of the second inverter 32. A second compensation capacitor 36 is connected between the output terminal 32b of the first inverter 32 and the first input 46a of the sense amplifier 46. The input terminal 32a of the second inverter 32 is connected to the second input 46b of the sense amplifier 46.

The reading stage 17 further includes a reading switch 38, connected between the nodes 25a, 25b.

FIG. 5 shows the reading stage 17 in greater detail with respect to FIG. 4. In this connection, in FIG. 5 the first and second inputs 17a, 17b of the reading stage 17 are also designated by YMPS and $\overline{\text{YMPS}}$.

In greater detail, the reading stage 17 includes a control switch 40 for controlling the first inverter 26 and a control switch 42 for controlling the second inverter 32. The control switches 40, 42 are transistors of a PMOS type and are driven by a control signal EnableSA supplied by the control logic CL.

In a per se known manner, the first inverter 26 is formed by a PMOS transistor 26' and by an NMOS transistor 26". Likewise, the second inverter 32 is formed by a PMOS transistor 32' and an NMOS transistor 32".

In particular, the control switch 40 of the first inverter 26 has a first conduction terminal connected to a supply voltage $V_{DD}$ (included, for example, between 0 V and 1 V) and a second conduction terminal connected to a first conduction terminal of the PMOS transistor 26'. Further, the control switch 42 of the second inverter 32 has a first conduction terminal connected to the supply voltage $V_{DD}$ and a second conduction terminal connected to a first conduction terminal of the PMOS transistor 32'.

The gate terminals of the PMOS transistor 26' and the NMOS transistor 26" are connected together and form the input terminal 26a. The second conduction terminal of the PMOS transistor 26' and a first conduction terminal of the NMOS transistor 26" are connected together and form the output terminal 26b. The second conduction terminal of the NMOS transistor 26" is connected to ground.

The gate terminals of the PMOS transistor 32' and of the NMOS transistor 32" are connected together and form the input terminal 32a. The second conduction terminal of the PMOS transistor 32' and a first conduction terminal of the NMOS transistor 32" are connected together and form the output terminal 32b. The second conduction terminal of the NMOS transistor 32" is connected to ground.

The reading stage 17 further includes further initialisation switches 44, 45 (illustrated in FIG. 5), formed by NMOS transistors, which are driven by the signal EnableSA and are arranged between ground and the first and second input nodes 46a, 46b, respectively, of the sense amplifier 46. In use, the initialisation switches 44, 45 enable initialisation, at the start of a reading cycle, of the potential of the first and second inputs 46a, 46b of the sense amplifier 46 at the value of ground potential. In this way, at the start of each reading cycle, the coupling capacitors 22a, 22b are biased at a voltage corresponding to the potential of the charge line 19, whereas the compensation capacitors 30, 36 are biased at 0 V. In fact, the equilibrium switches 28, 34 are kept closed during the idle state of the sense amplifier 46, enabling complete discharge of the compensation capacitors 30, 36 and consequently preventing the sense amplifier 46 from behaving differently according to the history of the previous reading cycles.

The output terminal 26b of the first inverter 26 and the output terminal 32b of the second inverter 32 are connected to respective input terminals of a voltage comparator 50, designed to compare the voltage on the output terminals 26b, 32b of the first and second inverters 26, 32 and generate an output signal DataSense. For instance, the output signal DataSense has a logic value "0" if the voltage of the output terminal 26b of the first inverter 26 is lower than the voltage of the output terminal 32b of the second inverter 32; otherwise, it has a logic value "1".

FIGS. 6A-6H show the time plots of control signals of switches of the PCM device 1, using a common time scale; in this connection, the following applies:

when the voltage-clamp logic signal YMPS_CLAMP (FIG. 6A) has a logic value "0", the voltage-clamp switches 20a, 20b are closed; otherwise, they are open;

when the local-column-decoding signals $YO_L$, $YO_R$ (FIG. 6B) have a logic value "0", the local-selection switches 13a, 13b are closed; otherwise, they are open;

when the main-column-decoding signals $YN_L$, $YN_R$ (FIG. 6C) have a logic value "0", the main-selection switches 12a, 12b are closed; otherwise, they are open;

the precharge switches 14a, 14b are driven, respectively, by a logic signal /$YN_L$<i> and a logic signal /$YN_R$<i> (also denoted, more briefly, by /$YN_L$ and /$YN_R$), which are generated by the control logic CL so as to represent negated versions, respectively, of the corresponding main-column-decoding signals $YN_L$<i>, $YN_R$<i>; further, when the logic signals /$YN_L$<i>, /$YN_R$<i> have a logic value "0", the precharge switches 14a, 14b are closed; otherwise, they are open;

the selector elements 4b of the first and second memory cells 3', 3" are driven by a wordline signal $S_{WL}$ (FIG. 6D), applied on the wordline WL; in particular, when the wordline signal $S_{WL}$ has a logic value "0", the selector elements 4b are on; otherwise, they are off;

the signal EnableSA (FIG. 6E) drives the control switches 40, 42 and the initialisation switches 44, 45 as described previously; in particular, when the signal EnableSA has a logic value "0", i) the control switches 40, 42 are closed, whereas ii) the initialisation switches 44, 45 are open; otherwise, i) the control switches 40, 42 are open, whereas ii) the initialisation switches 44, 45 are closed;

the equilibrium switches 28, 34 are driven by an equilibrium signal EQ (FIG. 6F); in particular, when the equilibrium signal EQ has a logic value "1", the equilibrium switches 28, 34 are closed; otherwise, they are open;

the first and second coupling switches 24a, 24b are driven by a coupling signal HIZ (FIG. 6G), which is generated by the control logic CL and is such that, when it assumes a logic value "0", the first and second coupling switches 24a, 24b are closed; otherwise, they are open; and the reading switch 38 is driven by a reading signal NHIZ (FIG. 6H) generated by the control logic CL; in particular, when the reading signal NHIZ has a logic value "1", the reading switch 38 is open; otherwise the reading switch 38 is closed.

All this having been said, differential reading of the logic data stored in the pair formed by the first and second memory cells 3', 3" is carried out as described hereinafter.

In a first step of the method, the control signals of the PCM device 1 are in an initial configuration.

In detail, at an initial instant $t_0$, the signal YMPS_CLAMP has a logic value "0", the local-column-decoding signals $YO_L$, $YO_R$ have a logic value "1", the main-column-decoding signals $YN_L$, $YN_R$ have a logic value "1", the wordline signal $S_{WL}$ has a logic value "1", the signal EnableSA has a logic value "1", the equilibrium signal EQ has a logic value "1", the coupling signal HIZ has a logic value "0", and the reading signal NHIZ has a logic value "1".

In the initial configuration, and thus at the aforementioned initial instant $t_0$, the main-bitline capacitors 9', 9" are charged (as likewise all the main bitlines of the PCM device 1) at the voltage value BL_CHARGE of the charge line 19, since $/YN_L=0$ and $/YN_R=0$. Further, the coupling capacitors 22a, 22b are, respectively, connected to the first and second inputs 17a, 17b of the reading stage 17 via the first and second coupling switches 24a, 24b. Consequently, also the coupling capacitors 22a, 22b are charged at the voltage value of the charge line 19. At the same time, the local wordline WL is biased at a voltage value (for example, included between 1.5 V and 1.8V) such that the selector elements 4b of the memory cells 3', 3" are in an OFF state; this voltage value may be supplied to the local wordline WL by a charge pump (not illustrated).

The differential-reading operation starts at an instant $t_1$ subsequent to the initial instant $t_0$.

At the instant $t_1$, the local-column-decoding signals $YO_L$, $YO_R$ and the main-column-decoding signals $YN_L$, $YN_R$ change logic state, passing from the logic value "1" to the logic value "0", whereas the signal EnableSA passes from the logic value "1" to the logic value "0". The other control signals remain in the previous logic state (assumed at the instant $t_0$).

Consequently, at the instant $t_1$, the sense amplifier 46 is activated (EnableSA=0) and the equilibrium switches 28, 34 are still closed (EQ=1). In the absence of the first and second compensation capacitors 30, 36, the first inverter 26 would set a potential on the second input 46b of the sense amplifier 46 equal to the trip point, in general close to one half of the supply voltage $V_{DD}$, plus an offset voltage, whereas the second inverter 32 would set a potential on the first input 46a of the sense amplifier 46 equal to the trip point plus an offset voltage generally different from the offset voltage set on the second input 46b of the sense amplifier 46, on account of the technological process spread that induces a mismatch between the inverters 26, 32.

In actual fact, immediately prior to the instant $t_1$, the first and second compensation capacitors 30, 36 are discharged. Immediately after the instant $t_1$, the first input 46a of the sense amplifier 46 assumes a voltage ($V_{trip26}$) equal to the trip point of the first inverter 26, whereas the second input 46b of the sense amplifier 46 assumes a voltage ($V_{trip26}$) equal to the trip point of the second inverter 32. Consequently, the first and second coupling capacitors 22a, 22b are subject to voltages equal to BL_CHARGE−$V_{trip26}$ and BL_CHARGE−$V_{trip32}$, respectively.

In practice, the presence of the first and second compensation capacitors 30, 36 enables storage of the two offset voltages. Consequently, at the moment when, in a subsequent step of the reading method, the equilibrium switches 28, 34 will be opened, the inverters 26, 32 will still be in their amplification region and arranged electrically in series. The resulting latch structure will thus be in a state of metastable equilibrium and will remain in this state until there occurs an event capable of perturbing this state. In the absence of the compensation capacitors 30, 36, the mismatch between the inverters 26, 32 would, instead, have caused an unforeseeable switching of the latch structure, upon opening of the equilibrium switches 28, 34.

Further, at the instant $t_1$, the local bitline $BL_L<j>$ and the corresponding local bitline $BL_R<j>$ are connected, respectively, to the main bitlines $MBL_L$, $MBL_R$ ($YO_L<j>=0$, $YO_R<j>=0$, $YN_L<i>=0$, $YN_R<i>=0$), which are disconnected from the charge line 19 ($/YN_L<i>=1$, $/YN_R<i>=1$) by the respective precharge switches 14a, 14b, but remain supplied by the charge line 19 by the respective voltage-clamp switches 20a, 20b (YMPS_CLAMP=0). In this way, the main-bitline parasitic capacitors are connected in parallel and charged at the voltage BL_CHARGE. The overall value of capacitance (which is of the order of hundreds of picofarads) is such that the capacitors form a sort of filter for the voltage BL_CHARGE. Consequently, when the decoding path that enables precharging of the bitline parasitic capacitors 4c is activated, the voltage drop on the charge line 19, due to the amount of charge transferred, will be negligible (in the region of ten millivolts). In other words, the voltage BL_CHARGE may be considered constant, even though it is generated by a charge pump. Further, the time of precharging of the bitline parasitic capacitors 4c depends, to a first approximation, just upon the resistance associated to the local-selection switches 13a and 13b and is thus of the order of nanoseconds. In this step, there is no static power consumption, since there is no passage of current in the memory cells 3 in so far as the row is not yet selected.

Following upon charging of the local bitlines $BL_L<j>$, $BL_R<j>$, at an instant $t_2$ subsequent to the instant $t_1$, a subsequent step of the reading method is carried out. The time interval between the instant $t_1$ and the instant $t_2$ is generated by an analog delay sized so as to guarantee charging of the local bitlines and is in the region of 1 ns.

At the instant $t_2$, the voltage-clamp signal YMPS_CLAMP changes logic state, passing from the logic value "0" to the logic value "1". Consequently, the voltage-clamp switches 20a, 20b are opened so as to enable, following upon the instant $t_2$, a possible variation of the voltages present on the first and second inputs 17a, 17b of the reading stage 17.

Next, at an instant $t_3$ subsequent to the instant $t_2$, the wordline signal $S_{WL}$ changes logic state, passing from the logic value "1" to the logic value "0". Consequently, the selector elements 4b turn on, enabling a passage of current.

In practice, the voltage-clamp signal YMPS_CLAMP switches before the wordline signal $S_{WL}$. The time interval that elapses between the instant $t_2$ and the instant $t_3$ is of the order of hundreds of picoseconds and guarantees that switching of the voltage-clamp signal YMPS_CLAMP occurs prior to switching of the wordline signal $S_{WL}$.

Upon turning-on of the selectors 4b, the first and second memory cells 3', 3" are disconnected from the charge line 19, thus preventing consumption of direct current by the charge pump 39 connected to the charge line 19. Further, at the instant $t_3$, the bitline capacitors 4c and the main-bitline capacitors 9', 9" start to discharge via a passage of current through the respective memory cell.

The values of the currents passing through the first and second memory cells 3', 3" depend upon the states of the respective storage elements 4a. In particular, if the storage element 4a is in a RESET state, the current through the memory cell is included, for example, between less than 100 nA and 5 µA; instead, if the storage element 4a is in a SET state, the current through the memory cell is included, for example, between 10 µA and 30 µA. Consequently, the left-hand side capacitors 4c, 9' and the right-hand side capacitors 4c, 9" of the memory array 2 discharge at different rates, so that voltages at the inputs 17a, 17b of the reading stage 17 (which are equivalent to the voltages of the respective common nodes 25a, 25b) will be different during the discharge process.

At an instant $t_4$, subsequent to the instant $t_3$ by a time interval Δt included, for example, between 4 ns and 6 ns, there is a voltage difference ΔV between the inputs 17a, 17b of the reading stage 17, and consequently a different voltage at the common nodes 25a, 25b, i.e., at the terminals of the coupling capacitors 22a, 22b connected to respective terminals of the coupling switches 24a, 24b. This voltage difference ΔV is, for example, higher than 30 mV when the difference between the currents passing through the first and second memory cells 3', 3" is on average 2 μA during the time interval Δt.

At the instant $t_4$, the bitline capacitors 4c and the main-bitline capacitors 9', 9" are only partially discharged.

At the instant $t_4$, the first and second coupling switches 24a, 24b are open, since the signal HIZ switches to "0". Consequently, the common nodes 25a, 25b of the reading stage 17 are disconnected from the respective inputs 17a, 17b of the reading stage 17, and the voltage between the common nodes 25a, 25b does not vary any further (it is "frozen" at the last voltage value assumed during the time interval Δt). Further, the voltage of the bitline capacitors 4c and of the main-bitline capacitors 9', 9" tends to an asymptote.

At an instant $t_5$ subsequent to the instant $t_4$, the first and second equilibrium switches 28, 34 are opened, since the equilibrium signal EQ switches to "0", whereas the reading switch 38 is closed, since the reading signal NHIZ switches to "1".

As mentioned previously, opening of the equilibrium switches 28, 34 causes the sense amplifier 46 to be in a condition of metastable equilibrium. In addition, closing of the reading switch 38 (at the instant $t_5$, as has been said, or else also subsequently) arranges in series the coupling capacitors 22a, 22b so as to eliminate the common-mode voltage between the coupling capacitors 22a, 22b (due to precharging of the main-line capacitors 9', 9"). In practice, immediately prior to the instant $t_5$, the difference of potential between the input terminal 26a and the output terminal 26b of the first inverter 26 is zero, as likewise the difference of potential between the input terminal 32a and the output terminal 32b of the second inverter 32. Immediately after the instant $t_5$, the difference of potential between the input terminal 26a and the output terminal 26b of the first inverter 26, as likewise the difference of potential between the input terminal 32a and the output terminal 32b of the second inverter 32, is equal to the difference of potential between the common nodes 25a, 25b, irrespective of the offsets of the first and second inverters 26, 32.

Consequently, even though the step of precharging of the main-bitline capacitors 9', 9" has been carried out at high voltages (up to values, for example, included between 1.5 V and 1.8 V), use of the coupling capacitors 22a, 22b enables the sense amplifier 46, supplied at a lower voltage (for example, lower than 1 V), to detect the voltage difference between the common nodes 25a, 25b, thus limiting power consumption.

The difference of potential present across the two coupling capacitors 22a, 22b, due to the previous difference between the discharge currents of the memory cells 3', 3", perturbs the condition of metastable equilibrium of the sense amplifier 46 and induces switching thereof according to the sign of the aforesaid difference of potential, such that the output terminals 26b, 32b of the inverters 26, 32 assume complementary logic values. In other words, the output terminals 26b, 32b of the inverters 26, 32 assume complementary logic values as a function of the states of the storage elements 4a of the first and second memory cells 3,' 3". For instance, the logic values corresponding to the voltage on the output terminals 26b, 32b of the inverters 26, 32 follow the rules listed in the table below.

| Memory cell 3' | Memory cell 3" | Output terminal 26b | Output terminal 32b |
|---|---|---|---|
| SET | RESET | "0" | "1" |
| RESET | SET | "1" | "0" |

In other words, after the instant t4, the latch structure evolves towards a first condition or a second condition of equilibrium, which depends upon the states of the storage elements 4a of the first and second memory cells 3', 3".

Once a good separation of the voltages of the output terminals 26b, 32b of the inverters 26, 32 has been reached, for example greater than 100 mV, it is possible to enable the comparator 50 so as to update the value of the output signal DataSense as a function of the logic data stored in the first and second memory cells 3', 3". The comparator 50 may thus be enabled before the condition of equilibrium is reached.

Next, it is possible to bring the control signals back into their initial condition at the instant $t_0$ described previously and thus complete a reading cycle. In particular, during passage of the wordline signal $S_{WL}$ to the logic state "1", discharge of the bitline capacitors 4c and of the main-bitline capacitors 9', 9" is interrupted.

The reading method described previously enables a differential reading to be carried out in an efficient way since it is based upon a comparison between the discharge rate of capacitors, in the presence of conditions of high balancing of the capacitive loads. However, the present applicant has noted how, at least in some circumstances, there is felt the need to be able to switch between different reading modes of a memory array.

The aim of the present disclosure is thus to provide a phase-change memory device that will meet at least in part the needs encountered.

According to the present disclosure, a phase-change memory device and a reading method are provided.

BRIEF DESCRIPTION OF THE DRAWINGS

For a better understanding of the present disclosure, preferred embodiments thereof will now be described, purely by way of non-limiting example, with reference to the attached drawings, wherein:

FIGS. 6A-6H show time plots of signals generated in the PCM device illustrated in FIG. 1;

FIGS. 8A-8B, 9, and 10 show circuit diagrams of portions of the PCM device illustrated in FIG. 7;

FIGS. 13A and 13B show tables indicating signals generated in the PCM device illustrated in FIG. 7, during the aforementioned reading modes;

DETAILED DESCRIPTION OF ILLUSTRATIVE EMBODIMENTS

As described hereinafter, the present applicant has noted how it is possible to modify the reading stage described previously so as to be able to implement, alternatively, either a reading of a differential type (also referred to as "normal" reading mode) or a reading of a so-called single-ended type (also referred to as "verify" reading mode) of memory cells. In this connection, in what follows a PCM device 100 is described, limitedly to the differences with respect to the PCM device 1. In addition, components that are already present in the PCM device 1 are designated by the same references, except where otherwise specified.

Figure 7:
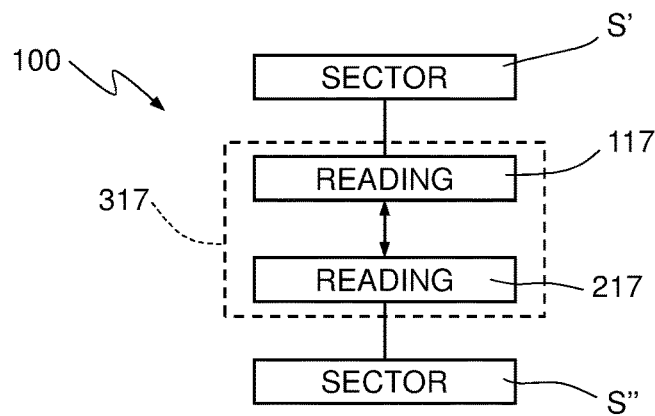
FIG. 7 shows a block diagram of the present PCM device.

As illustrated in FIG. 7, the memory array 2 includes, in addition to the first sector S', also a second sector S", the first and second sectors S', S" being arranged symmetrically with respect to an intermediate stage 317, described hereinafter. The first and second sectors S', S" may be the same as one another.

In detail, the intermediate stage 317 includes a top reading stage 117 and a bottom reading stage 217.

Figure 8A:
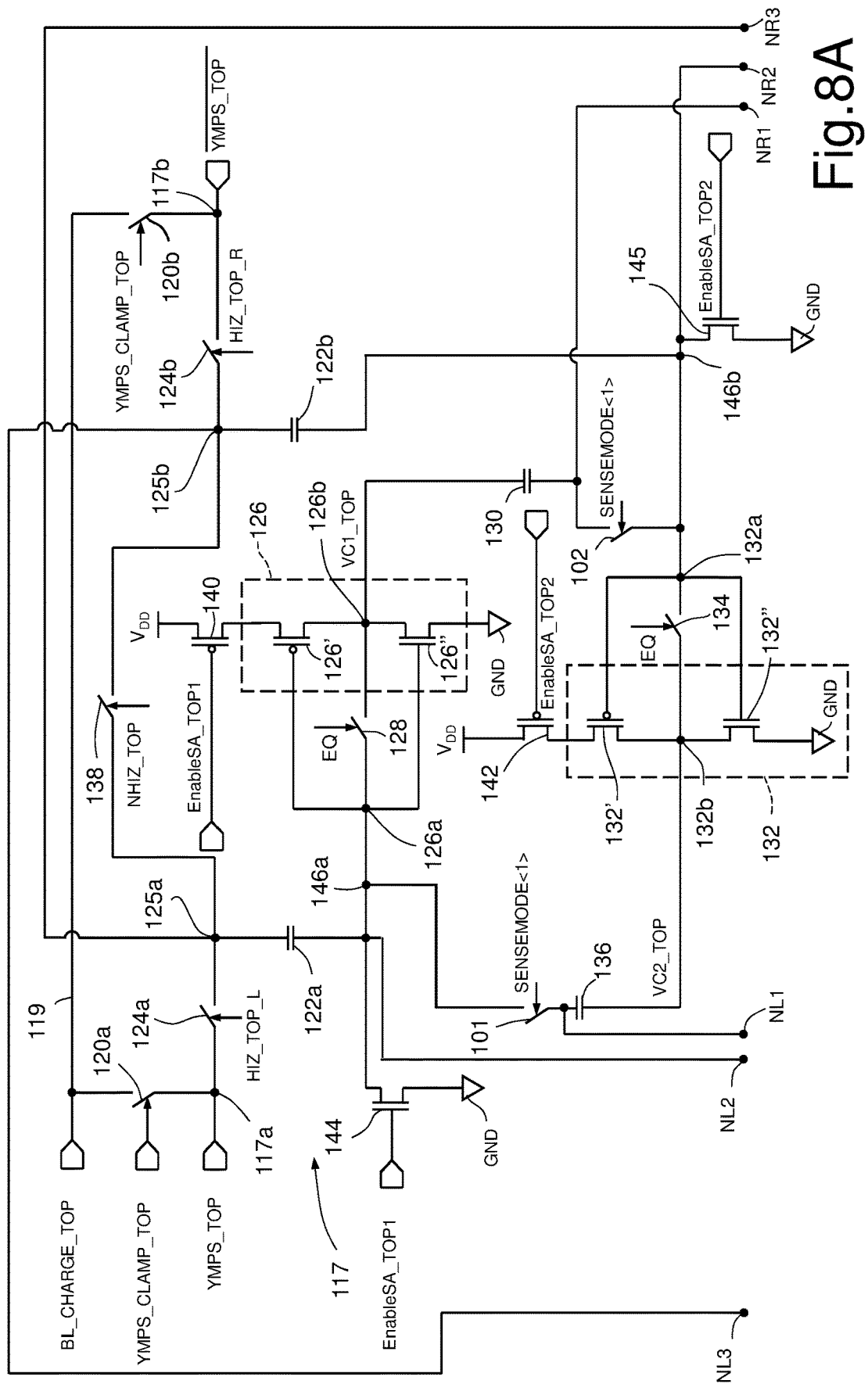
Figure 9:
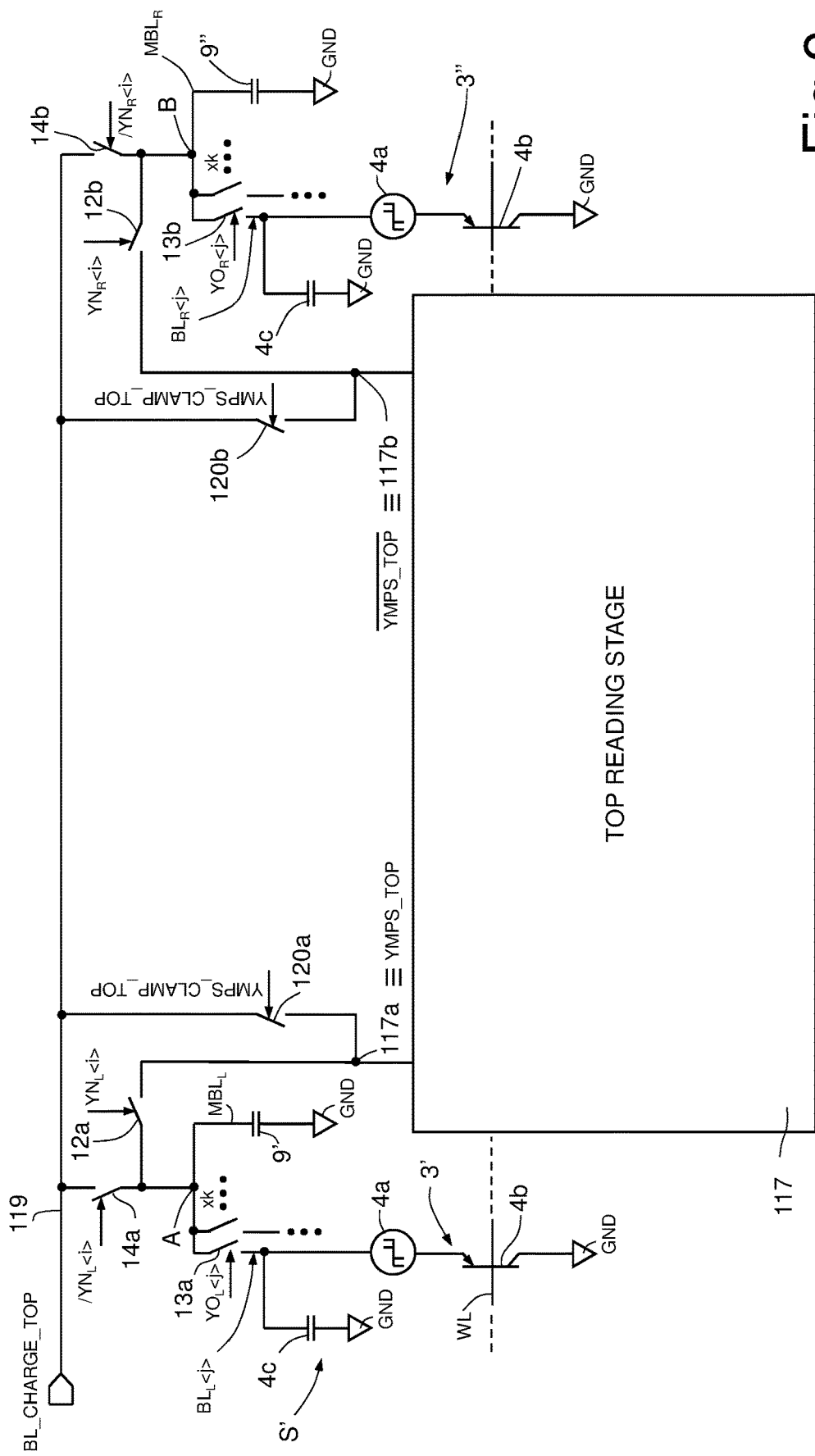

In greater detail, the top reading stage 117 is illustrated in FIG. 8A and is now described limitedly to the differences with respect to the reading stage 17. Components of the top reading stage 117 that are already present in the reading stage 17 are designated by the same reference numbers, increased by one hundred, except where otherwise specified. Further, in FIG. 8A likewise visible are the voltage-clamp switches (here designated by 120a and 120b) and the charge line (here designated by 119), which is set at the voltage BL_CHARGE_TOP (equal to the aforementioned voltage BL_CHARGE) and is referred to hereinafter as the top charge line 119. In addition, in FIG. 8A, the first and second inputs 117a, 117b of the top reading stage 117 are also denoted by YMPS_TOP and $\overline{\text{YMPS\_TOP}}$. It is further anticipated that, as regards the circuit details regarding coupling between the top reading stage 117 (in particular, the first and second inputs 117a, 117b) and the first sector S' (in particular, the first and second memory cells 3', 3", referred to hereinafter, respectively, as the first and second top memory cells 3', 3"), there applies what has been described with reference to FIG. 4 and to the reading stage 17. Coupling between the top reading stage 117 and the first sector S' is illustrated in FIG. 9, where the top reading stage 117 is illustrated in a simplified way.

This having been said, the top reading stage 117 includes a first additional control switch 101 and a second additional control switch 102.

The first additional control switch 101 is arranged between the first input 146a of the sense amplifier 146 and the second compensation capacitor 136. The second additional control switch 102 is arranged between the first compensation capacitor 130 and the second input 146b of the sense amplifier 146.

More in particular, if the terminal of the second compensation capacitor 136 opposite to the terminal of the capacitor connected to the output terminal 132b of the second inverter 132 is denoted by node NL1, the first additional control switch 101 is arranged between the first input 146a of the sense amplifier 146 and the node NL1. Further, if the terminal of the first compensation capacitor 130 opposite to the terminal of the capacitor connected to the output terminal 126b of the first inverter 126 is denoted by node NR1, the second additional control switch 102 is arranged between the node NR1 and the second input 146b of the sense amplifier 146.

To facilitate understanding of the relations existing between what is illustrated in FIG. 8A and what will be described with reference to FIG. 8B, in FIG. 8A further illustrated are the nodes NL2 and NL3, which coincide, respectively, with the first input 146a of the sense amplifier 146 and with the common node 125b, and the nodes NR2 and NR3, which coincide, respectively, with the second input 146b of the sense amplifier 146 and with the common node 125a.

This having been said, the following occurs:

the voltage-clamp switches 120a, 120b are driven by a top voltage-clamp signal YMPS_CLAMP_TOP generated by the control logic CL so that they are closed when the latter signal is equal to "0" and open otherwise;

the first and second coupling switches 124a, 124b are driven, respectively, by a first top coupling signal HIZ_TOP_L and a second top coupling signal HIZ_TOP_R, which are generated by the control logic CL so that they are open when the respective control signal assumes the logic value "0" and closed otherwise;

the reading switch 138 is driven by a top reading signal NHIZ_TOP generated by the control logic CL so that it is open when the reading signal NHIZ_TOP has a logic value "0" and closed otherwise;

the control switch 14o and the initialisation switch 144 are driven by a signal EnableSA_TOP1 generated by the control logic CL so that they are, respectively, open and closed when the signal EnableSA_TOP1 has a logic value "1" and are, respectively, closed and open otherwise;

the control switch 142 and the initialisation switch 145 are driven by a signal EnableSA_TOP2 generated by the control logic CL so that they are, respectively, open and closed when the signal EnableSA_TOP2 has a logic value "1" and, respectively, closed and open otherwise;

the first and second additional control switches 101, 102 are driven both by a signal SENSEMODE<1> generated by the control logic CL so that they are closed when the signal SENSEMODE<1> is equal to "1" and open otherwise;

the equilibrium switches 128, 134 are driven by the equilibrium signal EQ so that they are closed when the equilibrium signal EQ has a logic value "1" and open otherwise; and the selector elements 4b of the first and second top memory cells 3', 3" are driven by a wordline signal WL_TOP, which is applied to the corresponding wordline WL.

Once again with reference to FIG. 8A, the signals present on the output terminals 126b and 132b of the first and second inverters 126, 132 are denoted, respectively, by VC1_TOP and VC2_TOP.

Figure 1:
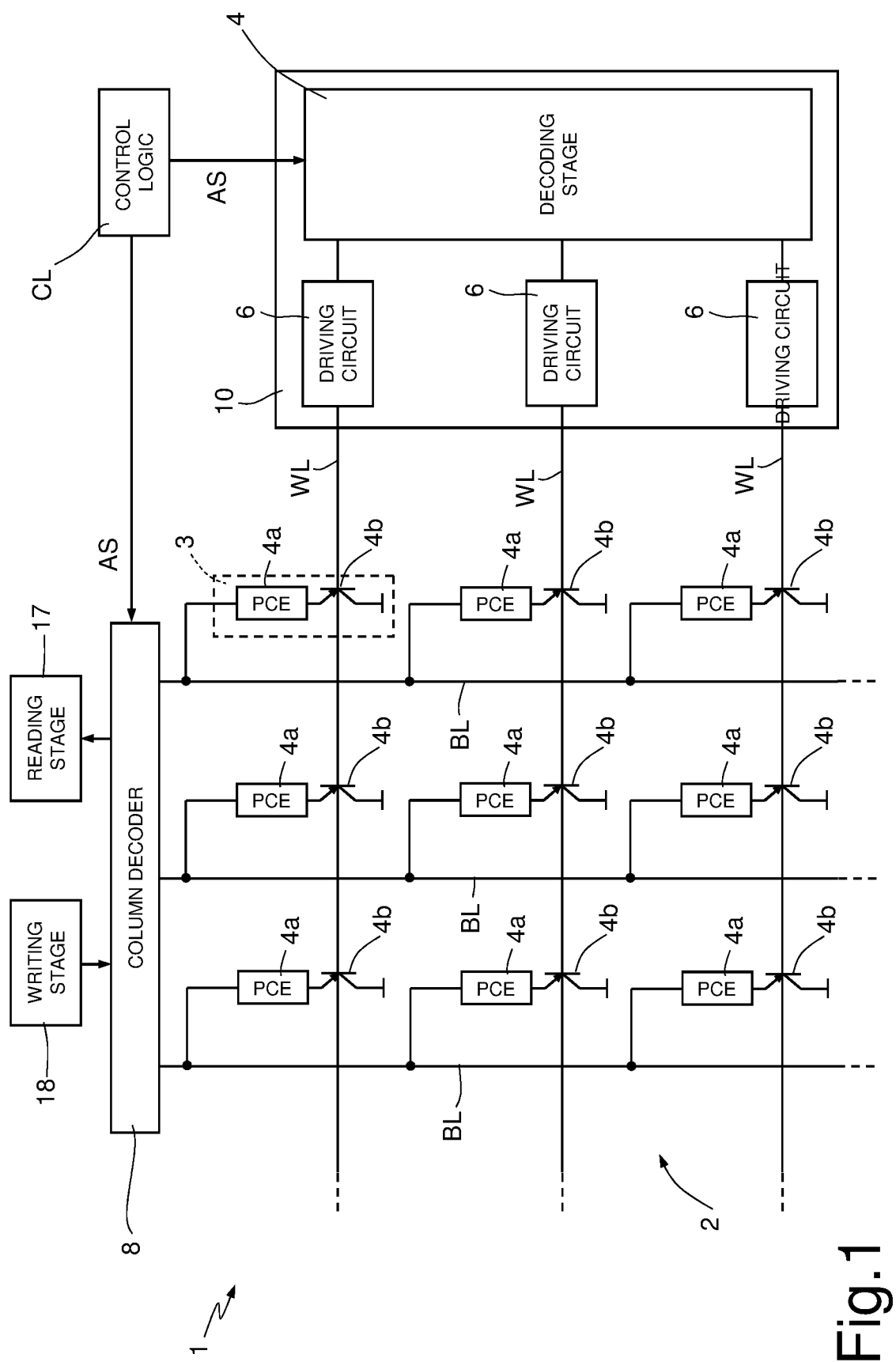
FIG. 1 shows a block diagram of a PCM device.
Figure 2:
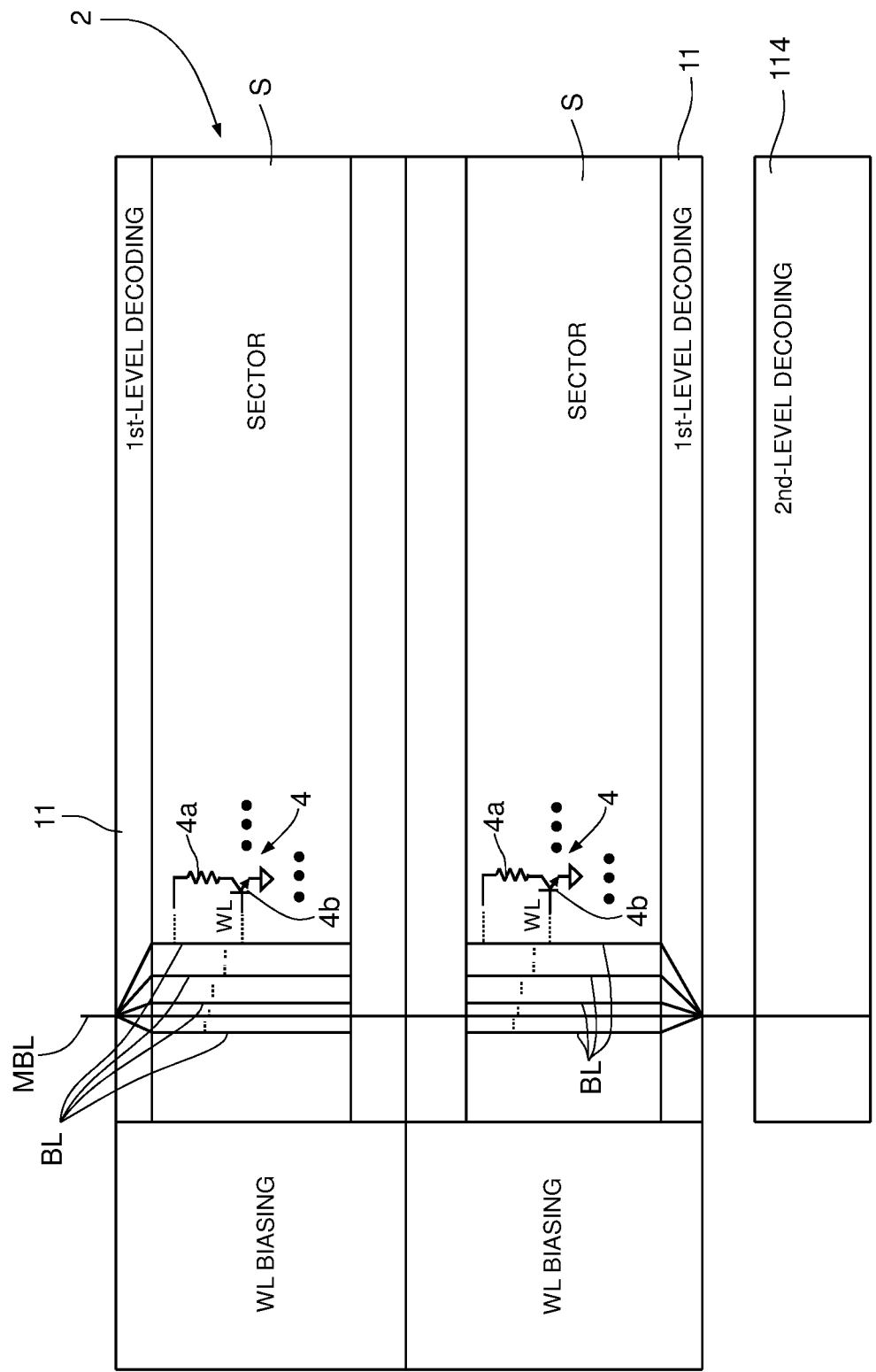
FIGS. 2 and 3 show block diagrams of portions of the PCM device illustrated in FIG. 1.
Figure 3:
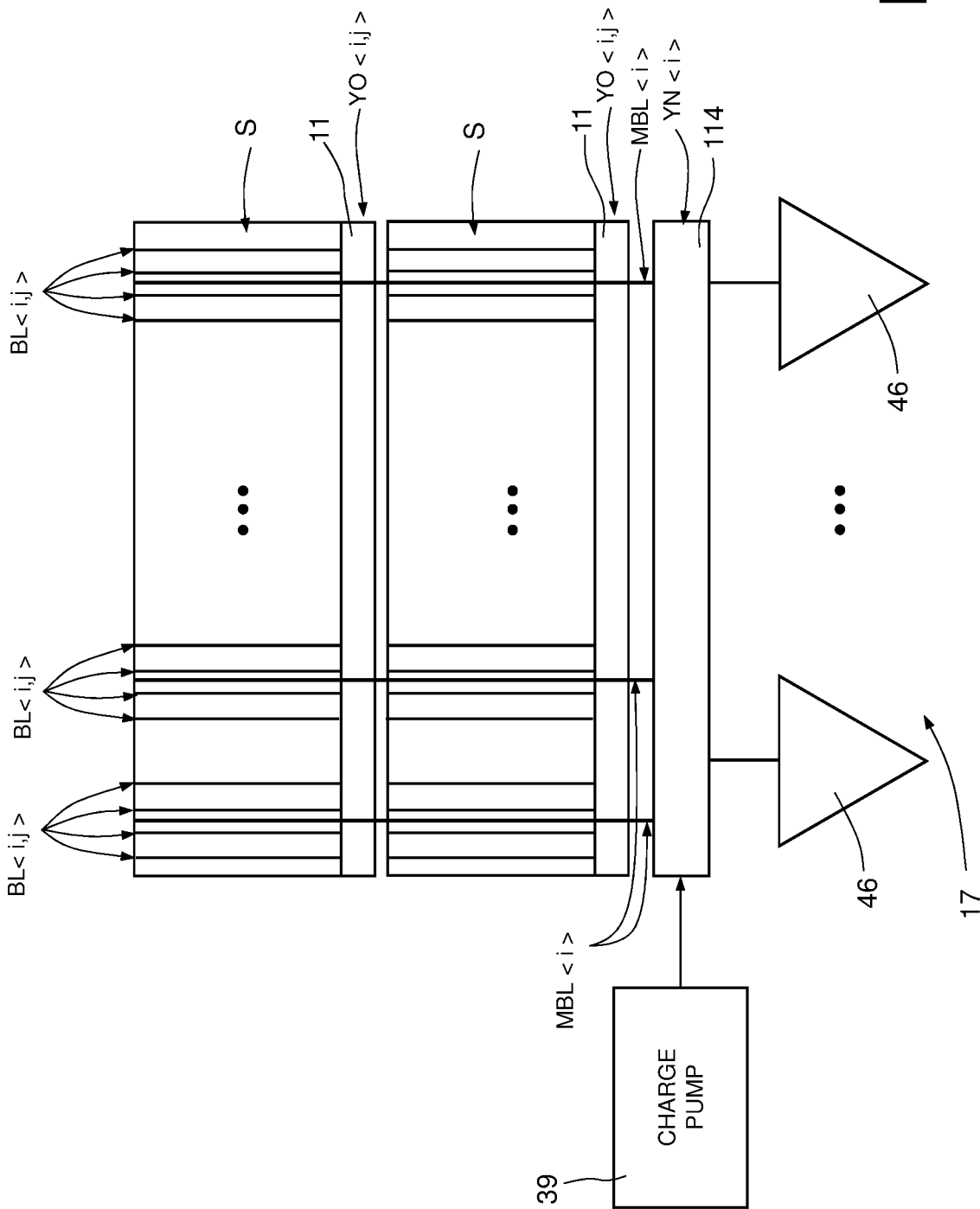
Figure 4:
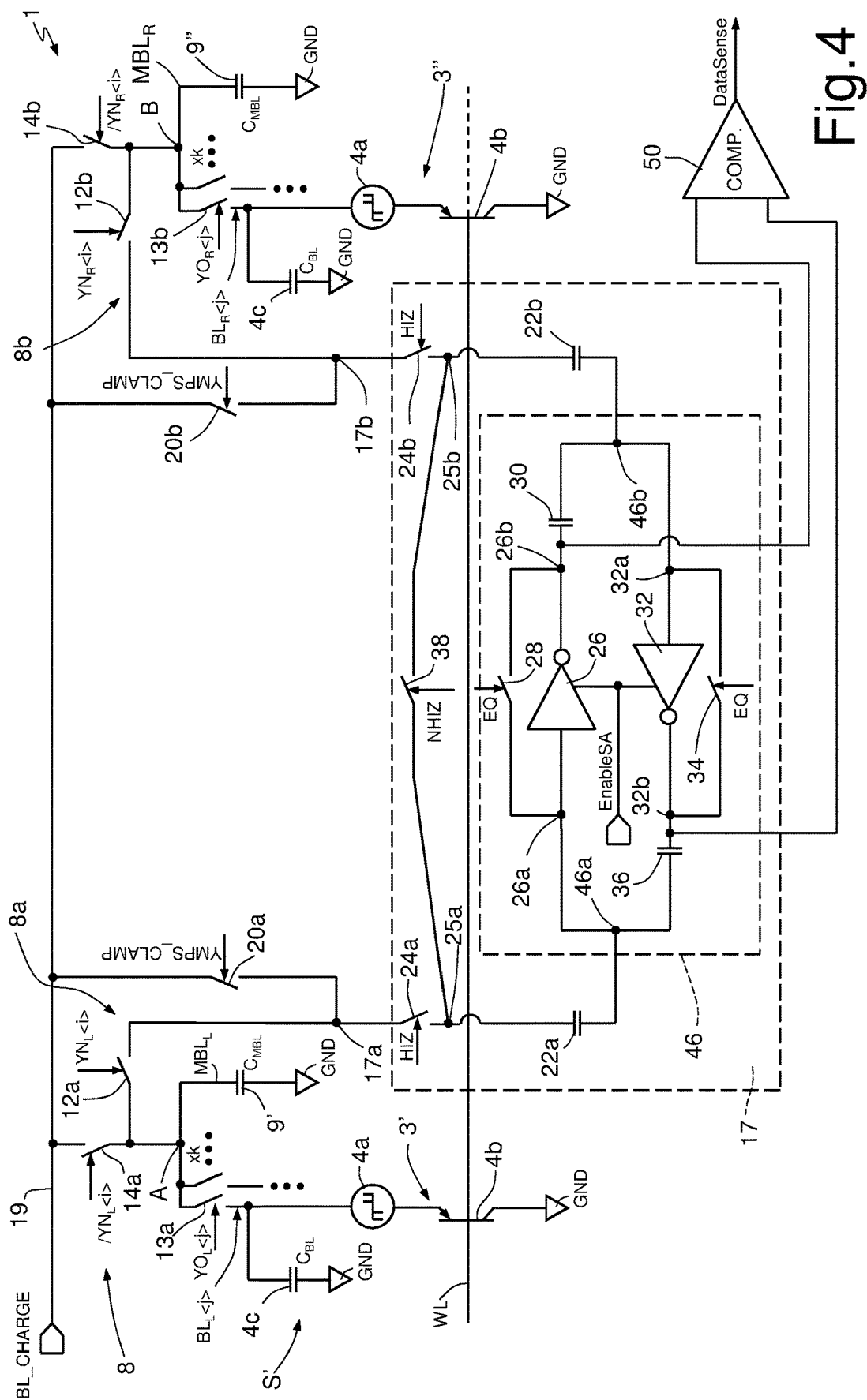
FIG. 4 shows a circuit diagram of a portion of the PCM device illustrated in FIG. 1.
Figure 5:
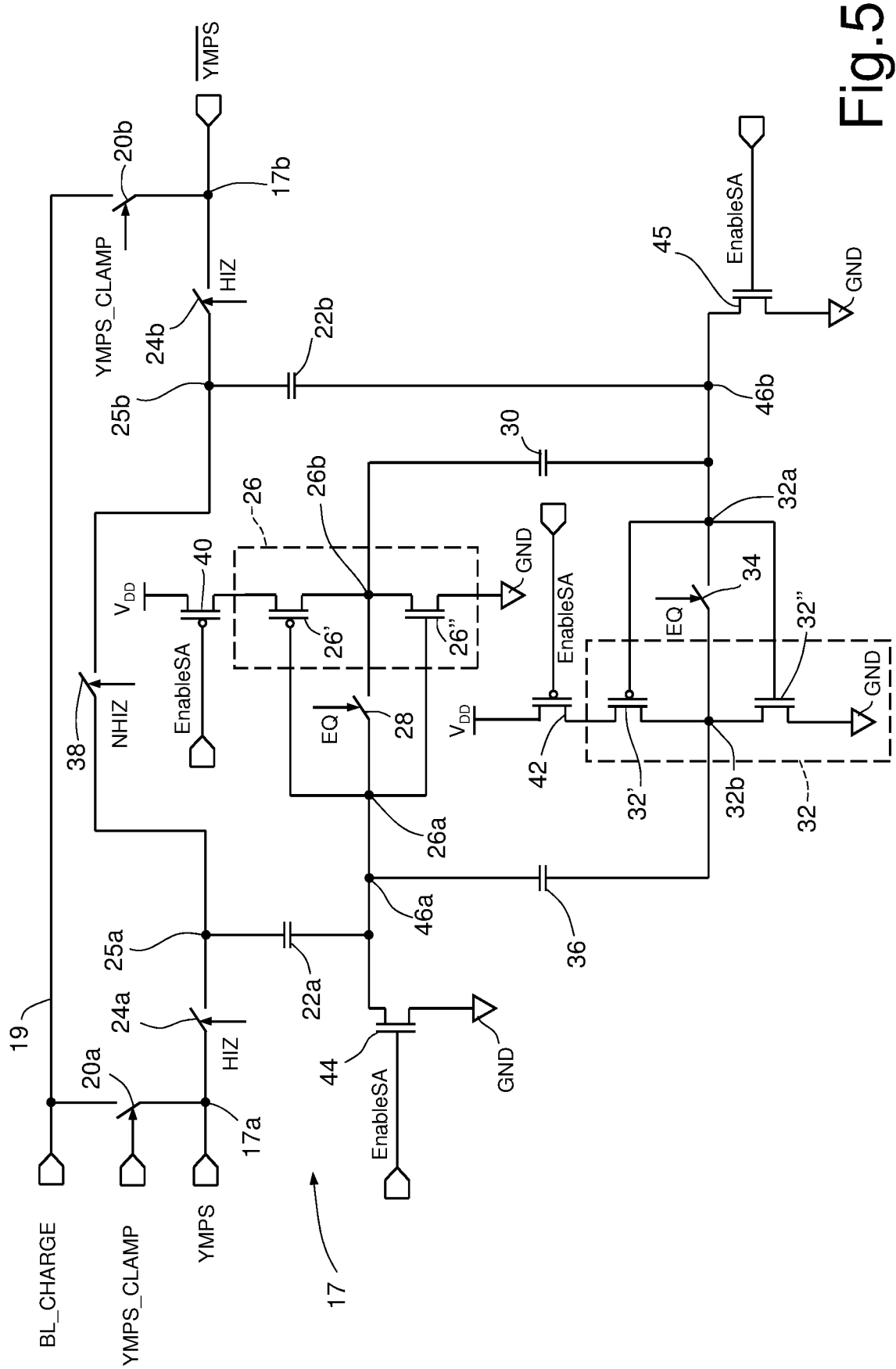
FIG. 5 shows a circuit diagram of a subportion of the portion of the PCM device illustrated in FIG. 4.

The bottom reading stage 217 is illustrated in FIG. 8B and is now described limitedly to the differences with respect to the top reading stage 117. Further, components of the bottom reading stage 217 that are already present in the top reading stage 117 are designated by the same reference numbers, increased by one hundred, except where otherwise specified, as for example in the case of the nodes NL1, NL2, NL3, NR1, NR2, NR3, which are now designated by the addition of a prime sign. In addition, likewise visible in FIG. 8B are further voltage-clamp switches (designated by 220a and 220b), which are coupled to a further charge line, which is set at the voltage BL_CHARGE_BOT (equal to the aforementioned voltage BL_CHARGE_TOP), and referred to hereinafter as bottom charge line 219. In addition, in FIG. 8B the first and second inputs 217a, 217b of the bottom reading stage 217 are also denoted by YMPS_BOT and $\overline{\text{YMPS\_BOT}}$. Further, the coupling between the bottom reading stage 217 and the second sector S" is the same as the coupling present between the top reading stage 117 and the first sector S', as explained also hereinafter. In this connection, it is anticipated that the second sector S" includes a first bottom memory cell 3''' and a second bottom memory cell 3'''', which are arranged symmetrically with respect to the first and second top memory cells 3', 3", respectively. Further, the first and second bottom memory cells 3''', 3'''' are coupled to corresponding local bitlines (denoted by $BL_L$<j>', in the case of the first bottom memory cell 3''', and by $BL_R$<j>', in the case of the second bottom memory cell 3''''), which may in turn be coupled to corresponding main bitlines (denoted, respectively, by $MBL_L$' and $MBL_R$'), and the corresponding main-bitline parasitic capacitors of which are denoted, respectively, by 9''' and 9'''', in a way identical to what is illustrated in FIG. 4 with reference to the memory cells 3', 3", to the local bitlines $BL_L$<j> and $BL_R$<j>, and to the main bitlines $MBL_L$ and $MBL_R$.

This having been said, in the bottom reading stage 217 the following occurs:

the voltage-clamp switches 220a, 220b are driven by a bottom voltage-clamp signal YMPS_CLAMP_BOT generated by the control logic CL so that they are closed when the latter signal is equal to "0" and open otherwise;

the first and second coupling switches 224a, 224b are driven, respectively, by a first bottom coupling signal HIZ_BOT_L and a second bottom coupling signal HIZ_BOT_R generated by the control logic CL so that they are open when the respective control signal assumes the logic value "0" and closed otherwise;

the reading switch 238 is driven by a bottom reading signal NHIZ_BOT generated by the control logic CL so that it is open when the bottom reading signal NHIZ_BOT has a logic value "0" and closed otherwise;

the control switch 240 and the initialisation switch 244 are driven by a signal EnableSA_BOT1 generated by the control logic CL so that they are, respectively, open and closed when the signal EnableSA_BOT1 has a logic value "1", and, respectively, closed and open otherwise;

the control switch 242 and the initialisation switch 245 are driven by a signal EnableSA_BOT2 generated by the control logic CL so that they are, respectively, open and closed when the signal EnableSA_BOT2 has a logic value "1", and, respectively, closed and open otherwise;

the first and second additional control switches 201, 202 are both driven by the signal SENSEMODE<1> so that they are closed when the signal SENSEMODE<1> is equal to "1" and open otherwise;

the equilibrium switches 228, 234 are driven by the equilibrium signal EQ so that they are closed when the equilibrium signal EQ has a logic value "1" and open otherwise; and the selector elements 4b of the first and second bottom memory cells 3''', 3'''' are driven by a wordline signal WL_BOT, which is applied to the wordline (designated by WL), to which the first and second bottom memory cells 3''', 3'''' are coupled.

Once again with reference to FIG. 8B, the signals present on the output terminals 226b and 232b of the first and second inverters 226, 232 are denoted, respectively, by VC1_BOT and VC2_BOT.

As illustrated again in FIG. 8B, the PCM device 100 includes six additional switches, arranged between the top reading stage 117 and the bottom reading stage 217 and designated by SW1_R, SW2_R, SW3_R and SW1_L, SW2_L, SW3_L.

In detail, the additional switch SW1_R is arranged between the nodes NR1 and NR2' and is driven by a signal SENSEMODE<2> generated by the control logic CL so that it is closed when the signal SENSEMODE<2> is equal to "1" and open otherwise.

The additional switch SW2_R is arranged between the nodes NR2 and NR1' and is driven by a signal SENSEMODE<0> generated by the control logic CL so that it is closed when the signal SENSEMODE<0> is equal to "1" and open otherwise.

The additional switch SW3_R is arranged between the nodes NR3 and NL3' and is driven by a signal NHIZ_TOPL_BOTR generated by the control logic CL so that it is closed when the signal NHIZ_TOPL_BOTR is equal to "1" and open otherwise.

The additional switch SW1_L is arranged between the nodes NL1 and NL2' and is driven by the signal SENSEMODE<0> so that it is closed when the signal SENSEMODE<0> is equal to "1" and open otherwise.

The additional switch SW2_L is arranged between the nodes NL2 and NL1' and is driven by the signal SENSEMODE<2> so that it is closed when the signal SENSEMODE<2> is equal to "1" and open otherwise.

The additional switch SW3_L is arranged between the nodes NL3 and NR3' and is driven by the signal NHIZ_TOPR_BOTL generated by the control logic CL so that it is closed when the signal NHIZ_TOPR_BOTL is equal to "1" and open otherwise.

Figure 10:
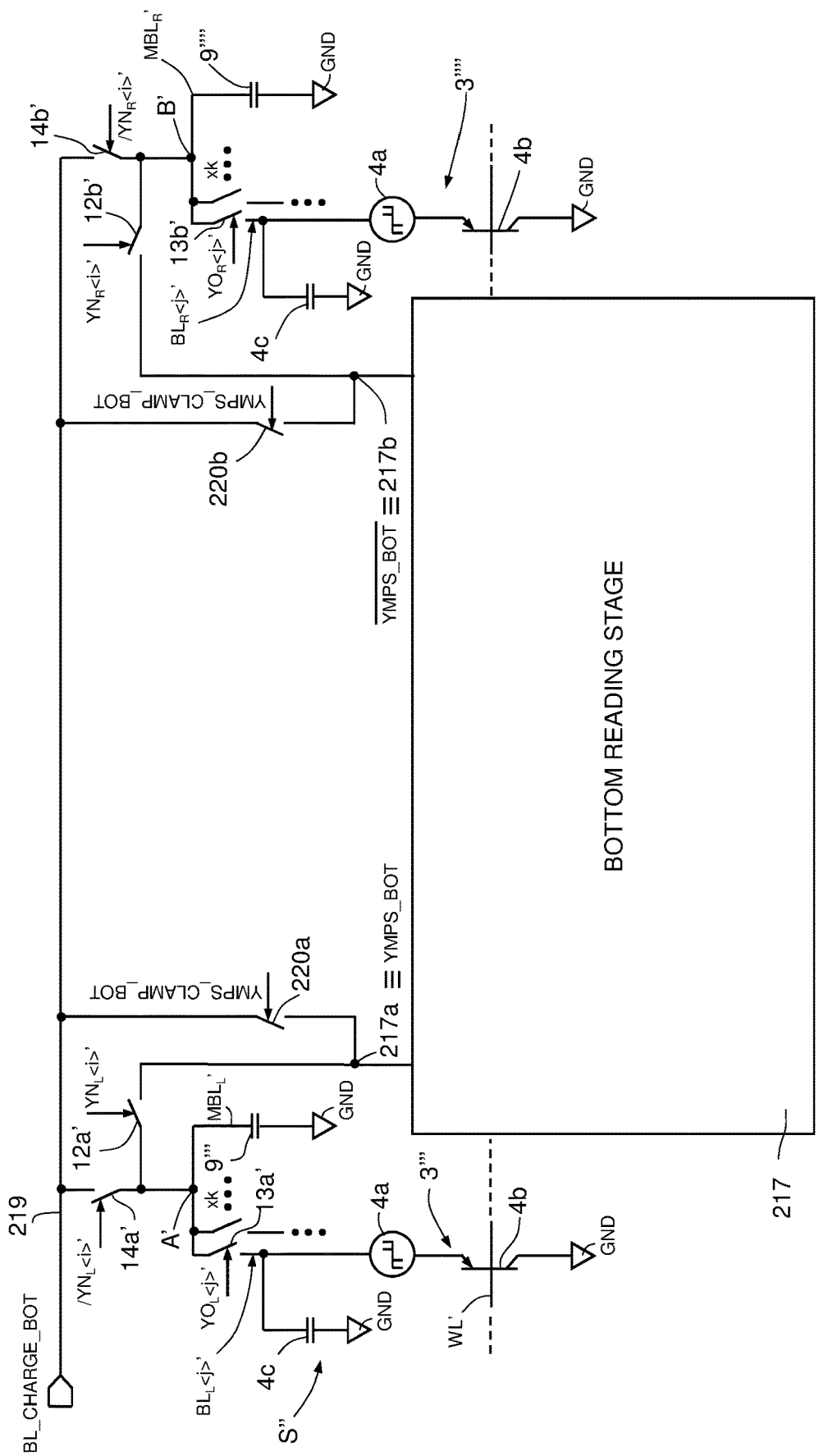

Coupling between the bottom reading stage 217 and the second sector S" is illustrated in FIG. 10, where the bottom reading stage 217 is illustrated in a simplified way, limitedly to the details that are useful for providing an understanding of the coupling with the second sector S".

In particular, the sense amplifier 246 is coupled to the first and second bottom memory cells 3''', 3''''.

Once again with reference to FIG. 10, the main-selection switches, the local-selection switches, and the precharge switches are denoted, respectively, by 12a'-12b', 13a'-13b', and 14a'-14b', whereas the signals that control these switches are denoted, respectively, as $YN_L$<i>'-$YN_R$<i>' (also abbreviated, in what follows, as $YN_L$'-$YN_R$'), $YO_L$<j>'-$YO_R$<j>' (also abbreviated, in what follows, as $YO_L$'-$YO_R$'), and /$YN_L$<i>'-/$YN_R$<i>'. Further, the nodes corresponding to the nodes A and B are designated by A' and B'.

Figure 11A:
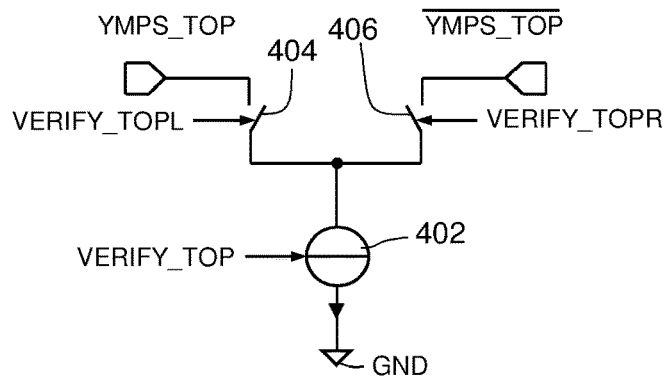
FIGS. 11A-11C show circuit diagrams of portions of the PCM device illustrated in FIG. 7.

As illustrated in FIG. 11A, the PCM device 100 further includes a first reference generator 402, configured to generate a reference current, and a first top mode switch 404 and a second top mode switch 406. The first reference generator 402 is controlled by a signal VERIFY_TOP so that it is on when the signal VERIFY_TOP is equal to "1" and off otherwise.

The first top mode switch 404 is arranged between the node YMPS_TOP and a first terminal of the first reference generator 402, the second terminal of which is connected to ground. The second top mode switch 406 is arranged between the node $\overline{\text{YMPS\_TOP}}$ and the first terminal of the first reference generator 402. The first and second top mode switches 404, 406 are controlled, respectively, by a signal VERIFY_TOPL and by a signal VERIFY_TOPR generated by the control logic CL so that they are open when the respective signals are equal to "0" and closed otherwise.

Figure 11B:
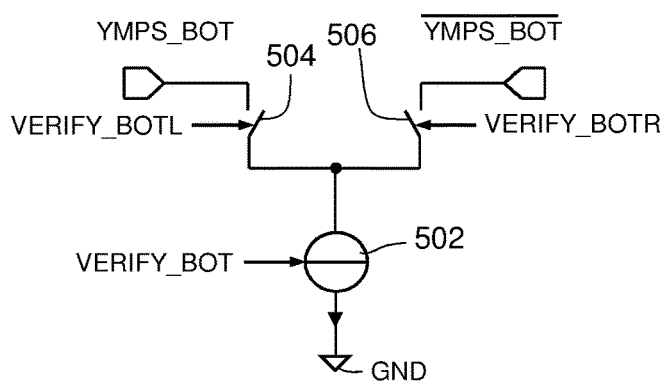

As illustrated in FIG. 11B, the PCM device 100 further includes a second reference generator 502, which is configured so that also this generates the reference current, and a first bottom mode switch 504 and a second bottom mode switch 506. The second reference generator 502 is controlled by a signal VERIFY_BOT so that it is on when the signal VERIFY_BOT is equal to "1" and off otherwise.

The first bottom mode switch 504 is arranged between the node YMPS_BOT and a first terminal of the second reference generator 502, the second terminal of which is connected to ground. The second bottom mode switch 506 is arranged between the node $\overline{\text{YMPS\_BOT}}$ and the first terminal of the second reference generator 502. The first and second bottom mode switches 504, 5006 are controlled, respectively, by a signal VERIFY_BOTL and by a signal VERIFY_BOTR generated by the control logic CL so that they are open when the respective signals are equal to "0" and closed otherwise.

Figure 11C:
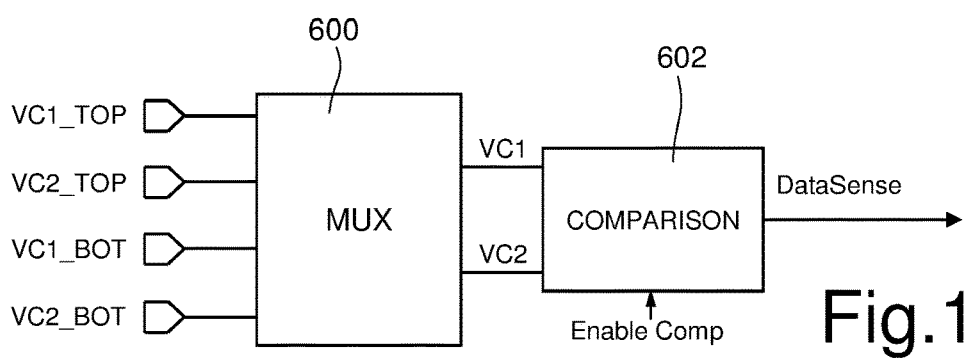

As illustrated in FIG. 11C, the PCM device 100 further includes a multiplexing stage 600, which receives at input the signals VC1_TOP and VC2_TOP present, respectively, on the output terminals 126b and 132b of the first and second inverters 126, 132 of the sense amplifier 146 of the top reading stage 117. Further, the multiplexing stage 600 receives at input the signals VC1_BOT and VC2_BOT present, respectively, on the output terminals 226b and 232b of the first and second inverters 226, 232 of the sense amplifier 246 of the bottom reading stage 217. As described hereinafter, the multiplexing stage 600 generates a signal VC1 and a signal VC2.

The PCM device 100 further includes a comparison stage 602, which generates the signal DataSense as a function of the signals VC1 and VC2, as described hereinafter, the signal DataSense indicating the outcome of the reading. For instance, timing of the comparison stage 60o is carried out on the basis of a signal EnableComp.

This having been said, in a first operating mode, the control logic CL issues a command for differential-mode reading alternatively on the part of the top reading stage 117 or else of the bottom reading stage 217. In other words, the pair of cells formed, alternatively, by the first and second top memory cells 3', 3", or else by the first and second bottom memory cells 3''', 3'''' is read in differential mode.

Figure 12:
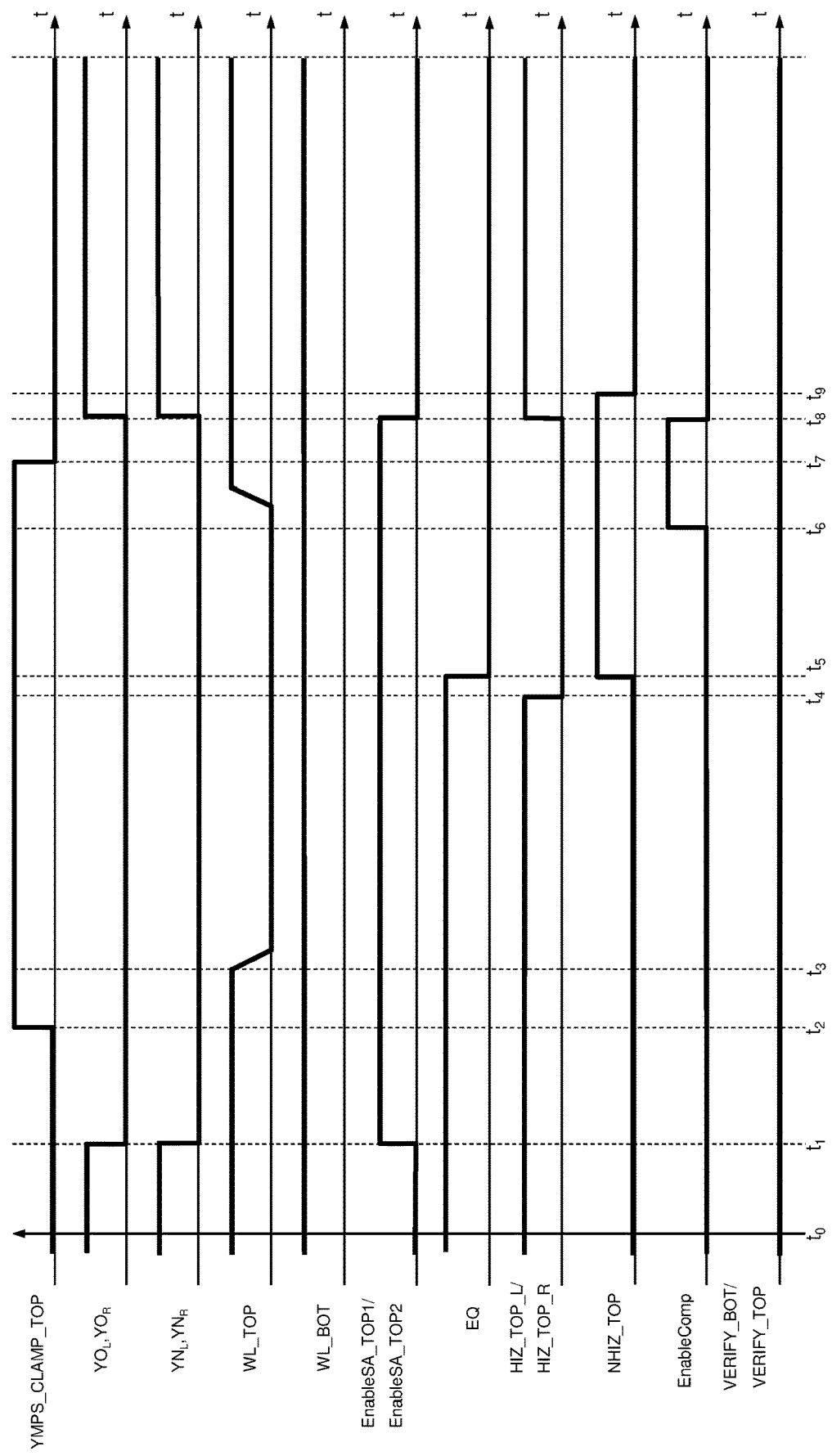
FIGS. 12, 14, 16, 17, 19, and 21 show time plots of signals generated in the PCM device illustrated in FIG. 7, during different reading modes.

For instance, in the case where the first and second top memory cells 3', 3" are read (case denoted by TOP-TOP in FIGS. 13A and 13B), the control logic CL operates so that, as shown in FIG. 12:

the top voltage-clamp signal YMPS_CLAMP_TOP follows the same pattern as the voltage-clamp signal YMPS_CLAMP illustrated in FIG. 6A;

the local-column-decoding signals $YO_L$, $YO_R$ have the same pattern as the one illustrated in FIG. 6B;

the main-column-decoding signals $YN_L$, $YN_R$ have the same pattern as the one illustrated in FIG. 6C, at the same time determining the pattern of the corresponding logic signals $/YN_L$ and $/YN_R$;

the wordline signal WL_TOP follows the same pattern as the wordline signal $S_{WL}$ illustrated in FIG. 6D, whereas the wordline signal WL_BOT remains equal to "1" so as to deselect the wordline WL' coupled to the first and second bottom memory cells 3''', 3'''';

the signals EnableSA_TOP1 and EnableSA_TOP2 follow the same pattern as the signal EnableSA illustrated in FIG. 6E;

the equilibrium signal EQ continues to have the same pattern as the one illustrated in FIG. 6F;

the top coupling signals HIZ_TOP_L and HIZ_TOP_R follow the same pattern as the coupling signal HIZ illustrated in FIG. 6G;

the top reading signal NHIZ_TOP follows the same pattern as the reading signal NHIZ illustrated in FIG. 6H; and the signal EnableComp switches from "0" to "1" at an instant $t_6$ so as to enable the comparison stage 602, which consequently updates the value of the signal DataSense.

Next, at an instant $t_7$, the top voltage-clamp signal YMPS_CLAMP_TOP returns to "0". At a subsequent instant $t_8$, also the local-column-decoding signals $YO_L$, $YO_R$, the main-column-decoding signals $YN_L$, $YN_R$, the signals EnableSA_TOP1 and EnableSA_TOP2, the signal EnableComp, and the top coupling signals HIZ_TOP_L and HIZ_TOP_R return to assuming the values that they had at the instant $t_0$. As regards, instead, the wordline signal WL_TOP, it returns to assuming the value "1" between the instant $t_6$ and the instant $t_7$. In addition, the top reading signal NHIZ_TOP returns to being equal to "1" at an instant $t_9$.

Once again with reference to FIG. 12, the signals VERIFY_BOT and VERIFY_TOP remain equal to "0" for the entire time interval $t_0$-$t_9$, so as to keep the first and second reference generators 402, 502 turned off.

In the above conditions, as illustrated synthetically in FIG. 13A, the control logic CL drives the multiplexing stage 600 so as to impose that the signals VC1, VC2 present on the output of the multiplexing stage 600 are equal to the signals VC1_TOP and VC2_TOP, respectively.

In addition, the control logic CL operates so that, for the entire time interval $t_0$-$t_9$:

the signal SENSEMODE<i> is equal to "1", so that, among other things, the first and second additional control switches 101, 102 of the top reading stage 117 are closed;

the signals SENSEMODE<0> and SENSEMODE<2> are equal to "0", so that the additional switches SW1_R, SW2_R and SW1_L, SW2_L are open; and the signals NHIZ_TOPL_BOTR and NHIZ_TOPR_BOTL are equal to "0", so that the additional switches SW3_R and SW3_L are open.

In practice, the top reading stage 117 and the bottom reading stage 217 are decoupled, and the multiplexing stage 600 connects the top reading stage 117 to the comparison stage 602. In turn, the top reading stage 117 operates like the reading stage 17.

Once again with reference to the signals generated by the control logic CL, FIG. 13B presents a table, the first row of which corresponds precisely to the differential reading of the first and second top memory cells 3', 3". Further, the table presents schematically the values assumed by the signals indicated therein, in the interval $t_0$-$t_9$; in the case where the wording "signal" is present, this means that the signal to which it refers is not constant and follows a corresponding pattern. In this connection, FIG. 13B shows how, in the case of differential reading of the first and second top memory cells 3', 3", the signals EnableSA_BOT1 and EnableSA_BOT2 are equal to "1", and thus the control switches 240, 242 are open, whereas the initialisation switches 244, 245 are closed. Further, the signals VERIFY_TOPL, VERIFY_TOPR, VERIFY_BOTL, and VERIFY_BOT are equal to "0". In addition, the bottom reading signal NHIZ_BOT is equal to "0", whereas the first and second bottom coupling signals HIZ_BOT_L, HIZ_BOT_R are equal to "1", so that the first and second coupling switches 224a, 224b are closed, whereas the reading switch 238 is open.

In a way similar to what has been said with reference to the differential reading of the first and second top memory cells 3', 3", the control logic CL may issue a command for differential reading of the first and second bottom memory cells 3''', 3"" (case denoted by BOT-BOT in FIGS. 13A and 13B).

In detail, the control logic CL operates so that, as illustrated in FIG. 13A, the signals VC1, VC2 present on the output of the multiplexing stage 600 are equal to the signals VC1_BOT and VC2_BOT, respectively. Further, as illustrated in FIG. 13B, the control logic CL operates so that:

the signal SENSEMODE<1> is equal to "1", so that, among other things, the first and second additional control switches 201, 202 of the bottom reading stage 217 are closed;

the signals SENSEMODE<0> and SENSEMODE<2> are equal to "0", so that the additional switches SW1_R, SW2_R and SW1_L, SW2_L are open;

the signals NHIZ_TOPL_BOTR and NHIZ_TOPR_BOTL are equal to "0", so that the additional switches SW3_R and SW3_L are open;

the signals EnableSA_TOP1 and EnableSA_TOP2 are equal to "1", and thus the control switches 140, 142 are open, whereas the initialisation switches 144, 145 are closed;

the signals VERIFY_TOPL, VERIFY_TOPR, VERIFY_BOTL, and VERIFY_BOT are equal to "0"; and the top reading signal NHIZ_TOP is equal to "0", whereas the first and second top coupling signals HIZ_TOP_L, HIZ_TOP_R are equal to "1" so that the first and second coupling switches 124a, 124b are closed, whereas the reading switch 138 is open.

Figure 14:
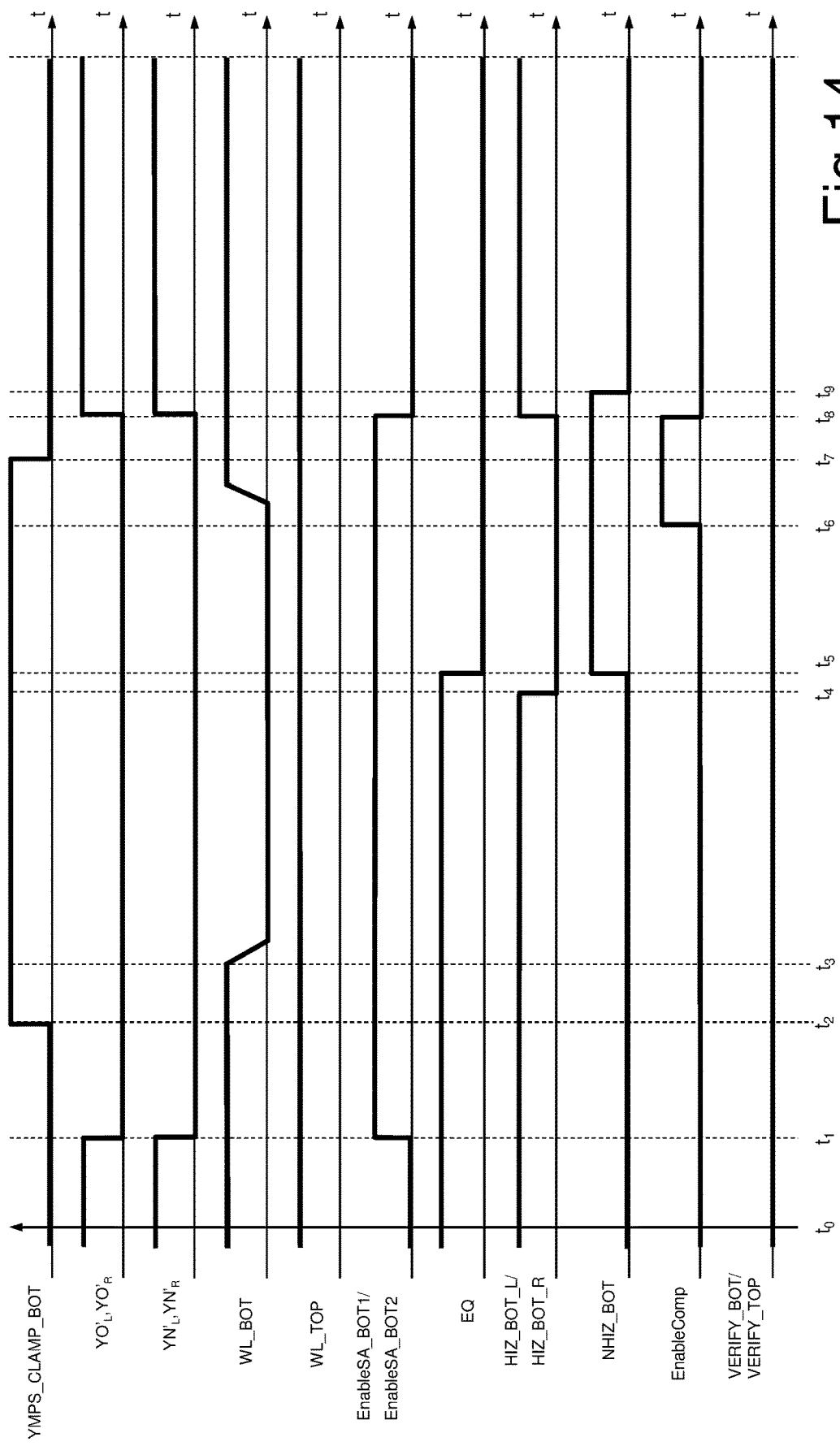

In addition, the control logic CL operates so that, as illustrated in FIG. 14:

the bottom voltage-clamp signal YMPS_CLAMP_BOT follows the same pattern as the voltage-clamp signal YMPS_CLAMP illustrated in FIG. 6A;

the local-column-decoding signals $YO_L'$, $YO_R'$ have the same pattern as the one illustrated in FIG. 6B;

the main-column-decoding signals $YN_L'$, $YN_R'$ have the same pattern as the one illustrated in FIG. 6C, at the same time determining the pattern of the corresponding logic signals $/YN_L'$ and $/YN_R'$;

the wordline signal WL_BOT follows the same pattern as the wordline signal $S_{WL}$ illustrated in FIG. 6D, whereas the wordline signal WL_TOP remains equal to "1", so as to deselect the wordline WL coupled to the first and second top memory cells 3', 3";

the signals EnableSA_BOT1 and EnableSA_BOT2 follow the same pattern as the signal EnableSA illustrated in FIG. 6E;

the equilibrium signal EQ continues to have the same pattern as the one illustrated in FIG. 6F;

the bottom coupling signals HIZ_BOT_L and HIZ_BOT_R follow the same pattern as the coupling signal HIZ illustrated in FIG. 6G;

the bottom reading signal NHIZ_BOT follows the same pattern as the reading signal NHIZ illustrated in FIG. 6H;

the signals VERIFY_BOT and VERIFY_TOP remain equal to "0" for the entire time interval $t_0$-$t_9$, so as to keep the first and second reference generators 402, 502 turned off; and the signal EnableComp follows the same pattern described with reference to FIG. 12.

In practice, the top reading stage 117 and the bottom reading stage 217 are decoupled and the multiplexing stage 600 connects the bottom reading stage 217 to the comparison stage 602. In turn, the bottom reading stage 217 operates like the reading stage 17.

Figure 15:
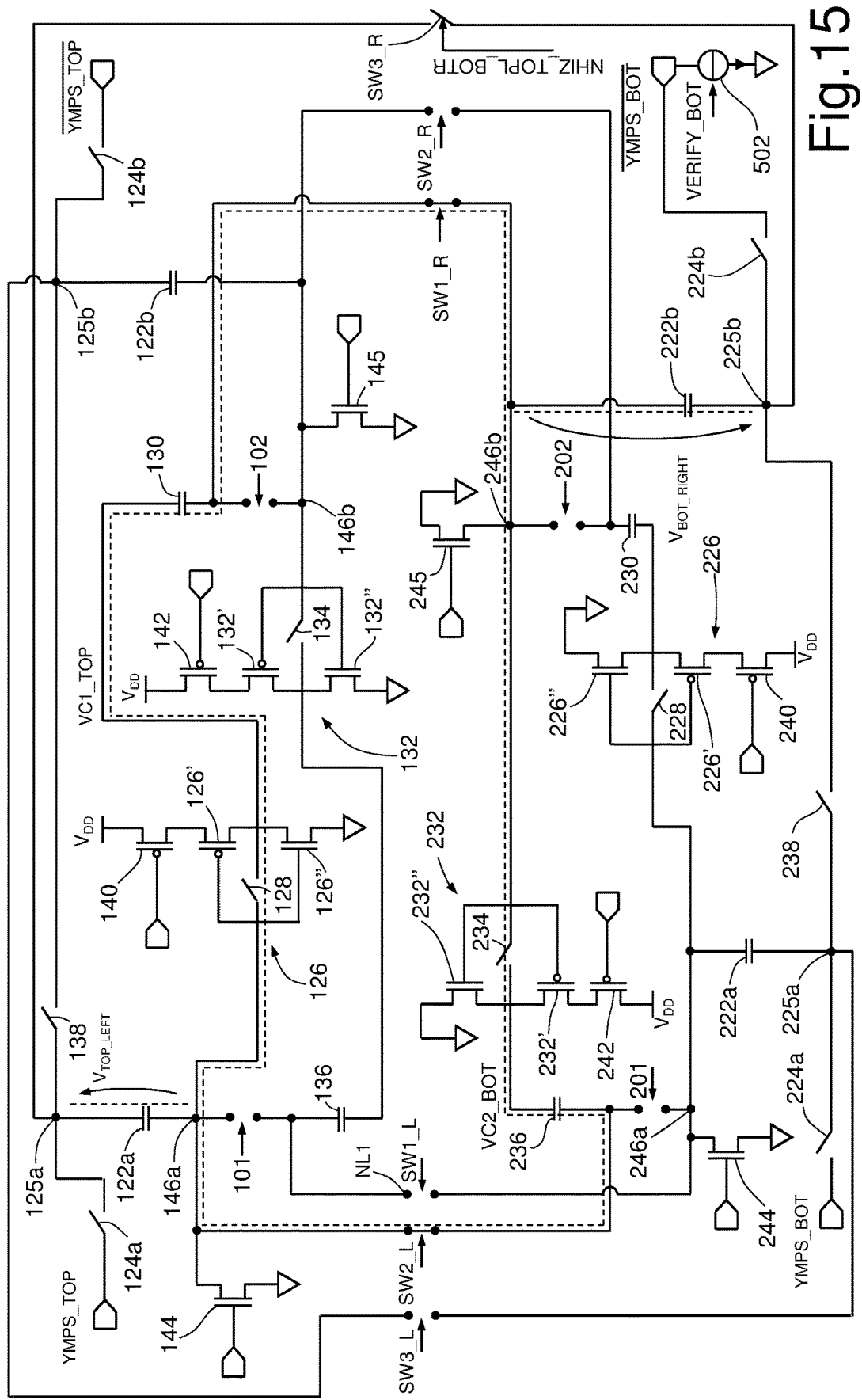
FIGS. 15, 18, 20, and 22 show circuit diagrams of portions of the PCM device illustrated in FIG. 7, regarding the reading modes referred to in FIGS. 16, 17, 19, and 21, respectively.

In a further operating mode, the control logic CL issues a command for single-ended reading of the first top memory cell 3' (case denoted as TOPL-BOTR in FIGS. 13A and 13B). In this case, the control logic CL operates so that, as illustrated in FIG. 13A, the signals VC1, VC2 present on the output of the multiplexing stage 600 are equal to the signals VC1_TOP and VC2_BOT, respectively. Further, as illustrated in FIG. 13B, the control logic CL operates so that:

the signal SENSEMODE<0> is equal to "0", so that the additional switches SW2_R and SW1_L are open;

the signal SENSEMODE<i> is equal to "0", so that the first and second additional control switches 101, 102 of the top reading stage 117 and the first and second additional control switches 201, 202 of the bottom reading stage 217 are open;

the signal SENSEMODE<2> is equal to "1", so that the additional switches SW1_R and SW2_L are closed;

the signal EnableSA_TOP2 is equal to "1", so that the control switch 142 and the initialisation switch 145 are open and closed, respectively;

the signal EnableSA_BOT1 is equal to "1", so that the control switch 240 and the initialisation switch 244 are open and closed, respectively;

the signals VERIFY_TOPL, VERIFY_TOPR and VERIFY_BOTL are equal to "0", whereas the signal VERIFY_BOTR is equal to "1", so that, as illustrated in FIG. 15, the second reference generator 502 is connected to the node $\overline{YMPS\_BOT}$;

the signal VERIFY_TOP is equal to "0", so that the first reference generator 402 is off;

the top reading signal NHIZ_TOP and the second top coupling signal HIZ_TOP_R are equal to "0", so that the reading switch 138 and the second coupling switch 124b are open;

the bottom reading signal NHIZ_BOT and the first bottom coupling signal HIZ_BOT_L are equal to "0", so that the reading switch 238 and the first coupling switch 224a are open; and the signal NHIZ_TOPR_BOTL is equal to "0", so that the additional switch SW3_L is open.

Figure 16:
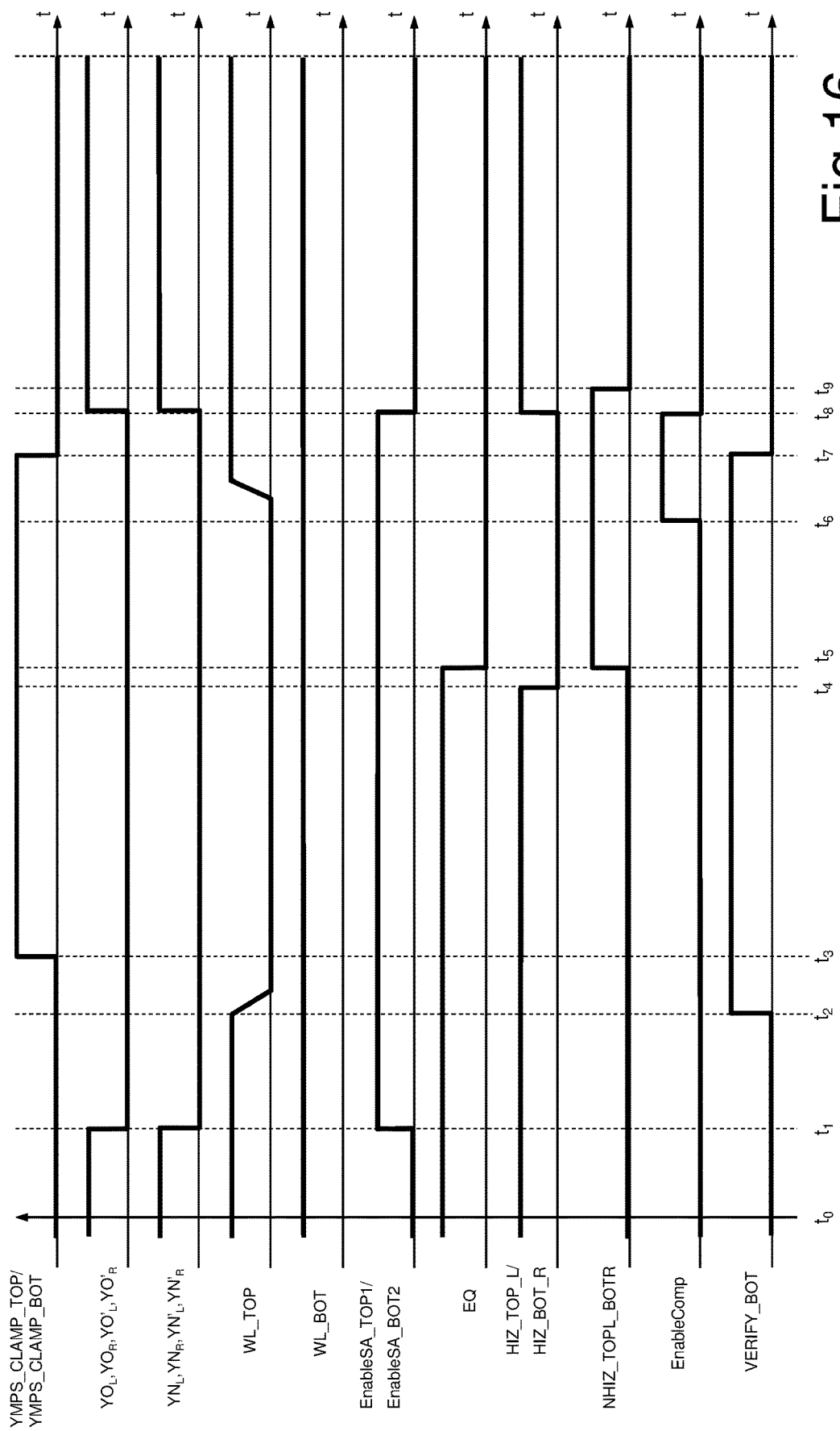

In addition, the control logic CL operates so that, as illustrated in FIG. 13B and in FIG. 16:

the top voltage-clamp signal YMPS_CLAMP_TOP and the bottom voltage-clamp signal YMPS_CLAMP_BOT follow the same pattern as the voltage-clamp signal YMPS_CLAMP illustrated in FIG. 6A, except for the fact that they switch to "1" at the instant $t_3$, instead of at the instant $t_2$;

the local-column-decoding signals $YO_L$, $YO_R$, $YO_L'$, $YO_R'$ present the same pattern as the one illustrated in FIG. 6B;

the main-column-decoding signals $YN_L$, $YN_R$, $YN_L'$, $YN_R'$ have the same pattern as the one illustrated in FIG. 6C;

the wordline signal WL_TOP follows the same pattern as the wordline signal $S_{WL}$ illustrated in FIG. 6D, except for the fact that it switches to "0" at the instant $t_2$, instead of at the instant $t_3$; instead, the wordline signal WL_BOT remains equal to "1";

the signals EnableSA_TOP1 and EnableSA_BOT2 follow the same pattern as the signal EnableSA illustrated in FIG. 6E;

the equilibrium signal EQ continues to have the same pattern as the one illustrated in FIG. 6F;

the first top coupling signal HIZ_TOP_L and the second bottom coupling signal HIZ_BOT_R follow the same pattern as the coupling signal HIZ illustrated in FIG. 6G;

the signal NHIZ_TOPL_BOTR follows the same pattern as the reading signal NHIZ illustrated in FIG. 6H;

the signal EnableComp follows the same pattern described with reference to FIG. 12; and the signal VERIFY_BOT has a value equal to "0" at the instant $t_0$ and switches to "1" at the instant $t_2$, maintaining the value up to the instant $t_7$; in this way, the second reference generator 502 remains on during the time interval $t_2$-$t_7$.

In practice, as may be seen in FIG. 15, the first inverter 126 and the first compensation capacitor 130 of the sense amplifier 146 of the top reading stage 117 and the second inverter 232 and the second compensation capacitor 236 of the sense amplifier 246 of the bottom reading stage 217 form a latch structure (referred to hereinafter also as the first aggregated latch structure) of the same type as the one described with reference to the reading stage 17, which remains in a state of metastable equilibrium until an event that is able to perturb this state occurs. The inputs of the aforesaid first aggregated latch structure are represented by the first input 146a of the sense amplifier 146 of the top reading stage 117 and by the second input 246b of the sense amplifier 246 of the bottom reading stage 217.

In addition, coupling of the second bottom memory cell 3'''' to the local bitline $BL_R\langle j\rangle'$ and to the corresponding main bitline $MBL_R'$, as well as to the second input 217b of the bottom reading stage 217 is carried out in the same way and with the same timing as those with which the first top memory cell 3' is coupled to the local bitline $BL_L\langle j\rangle$ and to the corresponding main bitline $MBL_L$, as well as to the first input 117a of the top reading stage 117.

In greater detail, the top voltage-clamp signal YMPS_CLAMP_TOP and the bottom voltage-clamp signal YMPS_CLAMP_BOT switch to "1" after the wordline WL of the first sector S' has been selected, whereas the wordline WL' of the second sector S" remains deselected. In this connection, the fact that selection of the wordline WL is in advance with respect to switching of the top voltage-clamp signal YMPS_CLAMP_TOP entails a certain loss of power, but enables simplification of implementation, since in this case it is possible to avoid synchronising turning-on of the reading reference (i.e., the signal VERIFY_BOT) with the signal $S_{WL}$ that activates the cell current.

All this having been said, between the instant $t_3$ and the instant $t_4$, there occurs a discharge of the bitline capacitor 4c corresponding to the first top memory cell 3' and of the main-bitline capacitor 9', through the first top memory cell 3', with a consequent variation of the voltage of the first input 117a of the top reading stage 117. Consequently, there occurs a variation of the voltage present on the common node 125a in a way similar to what has been described previously with reference, for example, to the case denoted as TOP-TOP. In particular, the voltage on the common node 125a varies up to the instant $t_4$, when the common node 125a is decoupled from the first input 117a of the top reading stage 117. The degree of the discharge depends upon the datum stored in the first top memory cell 3'.

In addition, during the time interval between the instant $t_3$ and the instant $t_4$, there occurs also a discharge of the bitline capacitor 4c corresponding to the second bottom memory cell 3'''' and of the main-bitline capacitor 9''''. In particular, since the wordline WL is deselected, the discharge is carried out through the second reference generator 502, and thus at a rate that depends upon the reference current.

In practice, during the time interval between the instant $t_3$ and the instant $t_4$, there occurs a variation of the voltage of the second input 217b of the bottom reading stage 217, the variation being a function of the reference current and being independent of the datum stored in the second bottom memory cell 3''''. Furthermore, the capacitance seen from the second input 217b of the bottom reading stage 217 is substantially equal to the capacitance seen from the first input 117a of the top reading stage 117.

The variation of the voltage on the second input 217b of the bottom reading stage 217 entails an equal variation of the voltage present on the common node 225b, in a way similar to what has been described previously with reference, for example, to the case denoted as BOT-BOT. In particular, the voltage on the common node 225b varies up to the instant $t_4$, when the common node 225b is decoupled from the second input 217b of the bottom reading stage 217.

At the instant $t_4$ there is thus present a voltage difference between the first input 117a of the top reading stage 117 and the second input 217b of the bottom reading stage 217, and thus between the inputs of the aforementioned first aggregated latch structure. The voltage difference depends upon the difference between the reference current and the current that flows in the first top memory cell 3', the latter current being a function of the datum stored in the first top memory cell 3'.

Subsequently to the instant $t_4$, the first coupling switch 124a decouples the common node 125a from the first input 117a of the top reading stage 117, and the second coupling switch 224b decouples the common node 225b from the second input 217b of the bottom reading stage 217. The voltage between the common nodes 125a and 225b is thus kept fixed to the value that it had at the instant $t_4$.

Subsequently, at the instant $t_5$, the equilibrium switches 128 and 234 are opened, whereas the additional switch SW3_R is closed. The difference of potential present across the first coupling capacitor 122a of the top reading stage 117 and the second coupling capacitor 222b of the bottom reading stage 217 (the voltages of which are denoted, respectively, by $V_{TOP\_LEFT}$ and $V_{BOT\_RIGHT}$ in FIG. 15) is thus due to the difference between the discharge current of the first top memory cell 3' and the reference current. This difference of potential perturbs the condition of metastable equilibrium of the first aggregated latch structure and induces switching thereof according to the sign of the aforesaid difference of potential. This switching causes the voltages VC1_TOP and VC2_BOT present on the output terminals, respectively, of the first inverter 126 of the sense amplifier 146 of the top reading stage 117 and of the second inverter 232 of the sense amplifier 246 of the bottom reading stage 217 to assume complementary logic values, which depend upon the difference between the discharge current of the first top memory cell 3' and the reference current. Since, as mentioned previously, the signals VC1, VC2 present on the output of the multiplexing stage 600 are, respectively, equal to the signals VC1_TOP and VC2_BOT, it is found that the signal DataSense, at output from the comparison stage 602, represents the comparison between the discharge current of the first top memory cell 3' and the reference current, and thus the datum stored in the first top memory cell 3. In other words, the signal DataSense represents a signal of single-ended reading of the first top memory cell 3'.

In particular, this reading mode may be used for judging the state of the cell addressed, i.e., for verifying whether the current of the cell addressed is higher or lower than a certain reference current. In other words, this reading mode may be used in all the SET and RESET algorithms in which the aim is to verify whether the SET or RESET operation has been able to bring about change of state of the cell.

Once again with reference to the case TOPL-BOPR, it may be noted how the first aggregated latch structure, the coupling switches 124a, 224b, and the additional switch SW3_R operate in the same way as described, for example, as regards the latch structure formed by the sense amplifier 146 of the top reading stage 117, of the equilibrium switches 124a, 124b, and of the reading switch 138, in the case referred to as TOP-TOP.

In a way similar to what has been described with reference to the case TOPL-BOTR, the control logic CL may issue a command for single-ended reading of any one from among the second top memory cell 3" and the first and second bottom memory cells 3'", 3"".

For instance, the case of single-ended reading of the second bottom memory cell 3"" (case referred to as BOTR-TOPL in FIGS. 13A, 13B) is now described with reference just to the differences with respect to the case TOPL-BOTR.

Figure 17:
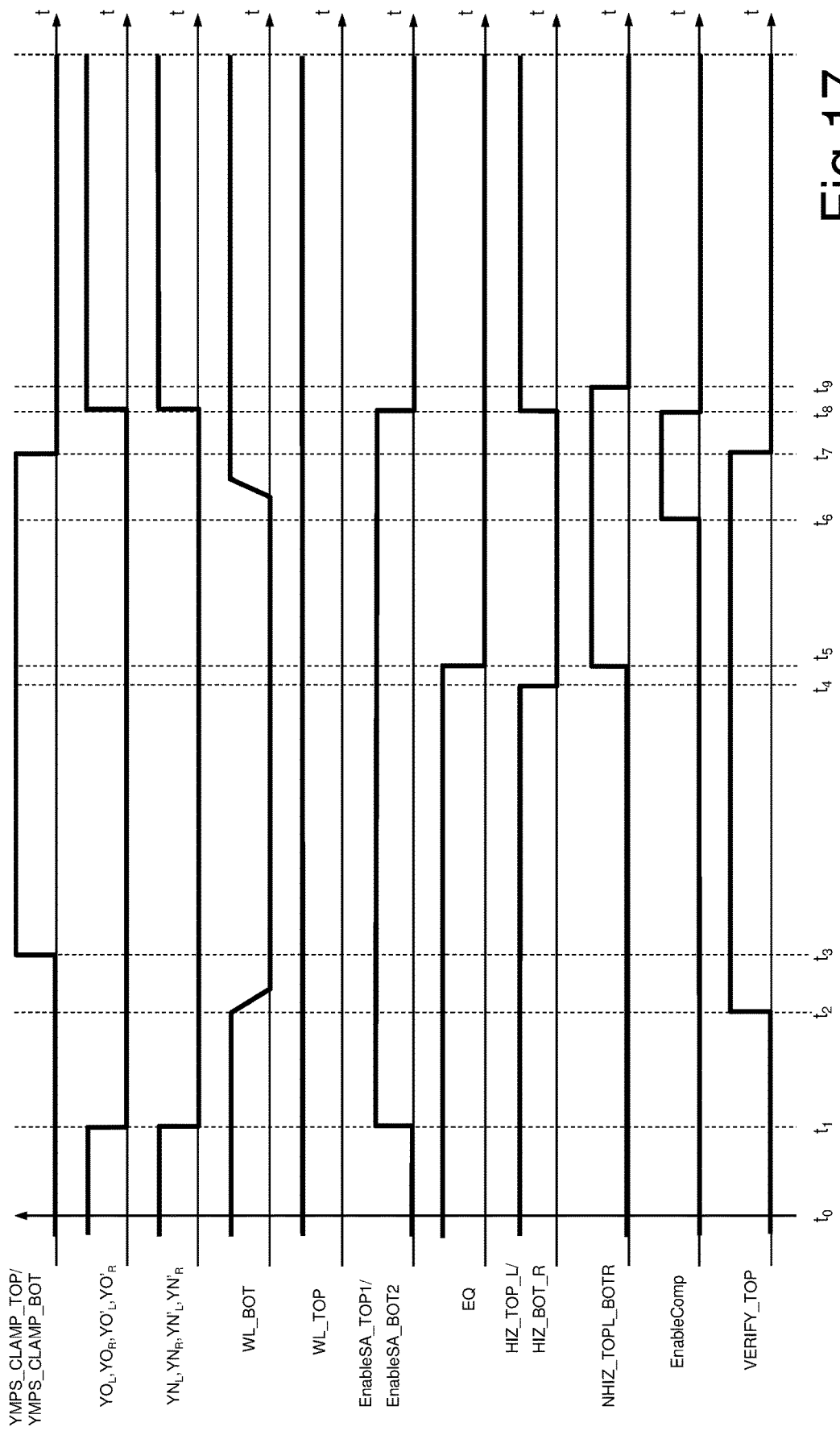

In detail, as emerges clearly from FIGS. 13A and 13B and from FIG. 17, the following occurs:

the signal VERIFY_TOPL is equal to "1", so that the first reference generator 402 is connected to the node YMPS_TOP, namely, to the first input 117a of the top reading stage 117;

the signal VERIFY_BOTR is equal to "0", so that the first reference generator 402 is disconnected from the node YMPS_BOT;

the signal VERIFY_BOT is equal to "0", so that the first reference generator 402 is off;

the signal VERIFY_TOP follows the same pattern as that of the signal VERIFY_TOP illustrated in FIG. 16; and the signals WL_TOP and WL_BOT have patterns reversed with respect to what is illustrated in FIG. 16, so that the wordline WL remains deselected.

Figure 18:
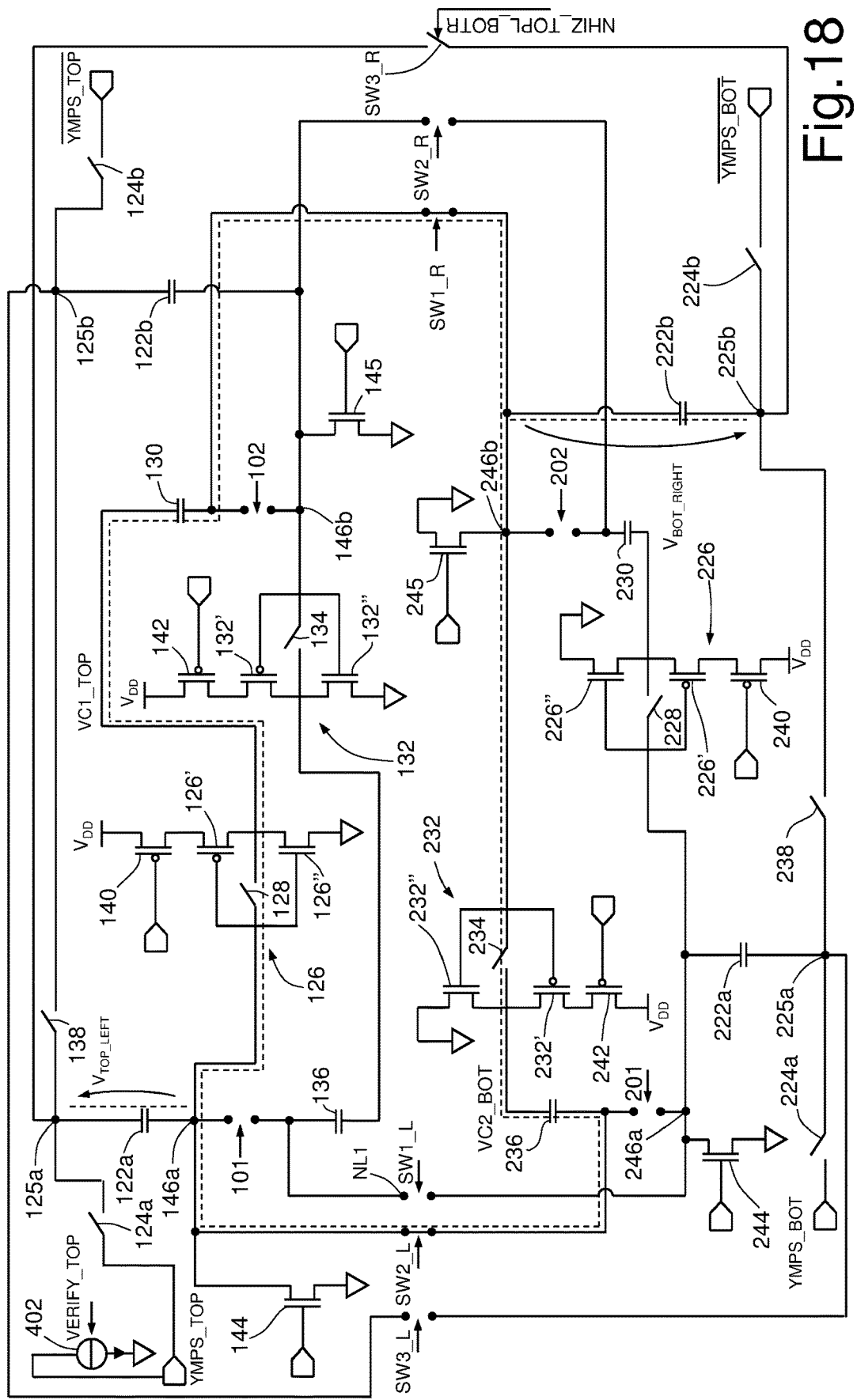

In practice, as illustrated in FIG. 18, the first aggregated latch structure does not change with respect to what is illustrated in FIG. 15. However, between the instants $t_3$ and $t_4$ there occurs a discharge of the bitline capacitor 4c corresponding to the second bottom memory cell 3"" and of the main-bitline capacitor 9"", through the second bottom memory cell 3"", with a consequent variation of the voltage of the second input 217b of the bottom reading stage 217. Instead, the first top memory cell 3' is discharged by the reference current, generated by the first reference generator 402.

In a way similar to what has been described with reference to the case TOPL-BOTR, the control logic CL may further issue a command for single-ended reading of the second top memory cell 3" (case denoted as TOPR-BOTL in FIGS. 13A, 13B), as described in what follows.

In detail, the signals VC1, VC2 present on the output of the multiplexing stage 600 are equal to the signals VC1_BOT and VC2_TOP, respectively. Further, the control logic CL operates so that:

the signal SENSEMODE<0> is equal to "1", so that the additional switches SW2_R and SW1_L are closed;

the signal SENSEMODE<i> is equal to "0", so that the first and second additional control switches 101, 102 of the top reading stage 117 and the first and second additional control switches 201, 202 of the bottom reading stage 217 are open;

the signal SENSEMODE<2> is equal to "0", so that the additional switches SW1_R and SW2_L are open;

the signal EnableSA_TOP1 is equal to "1", so that the control switch 14o and the initialisation switch 144 are open and closed, respectively;

the signal EnableSA_BOT2 is equal to "1", so that the control switch 242 and the initialisation switch 245 are open and closed, respectively;

the signals VERIFY_TOPL, VERIFY_TOPR and VERIFY_BOTR are equal to "0", whereas the signal VERIFY_BOTL is equal to "1", so that the second reference generator 502 is connected to the node YMPS_BOT;

the signal VERIFY_TOP is equal to "0", so that the first reference generator 402 is off;

the top reading signal NHIZ_TOP and the first top coupling signal HIZ_TOP_L are equal to "0", so that the reading switch 138 and the first coupling switch 124a are open; the bottom reading signal NHIZ_BOT and the second bottom coupling signal HIZ_BOT_R are equal to "0", so that the reading switch 238 and the second coupling switch 224b are open; and the signal NHIZ_TOPL_BOTR is equal to "0", so that the additional switch SW3_R is open.

Figure 19:
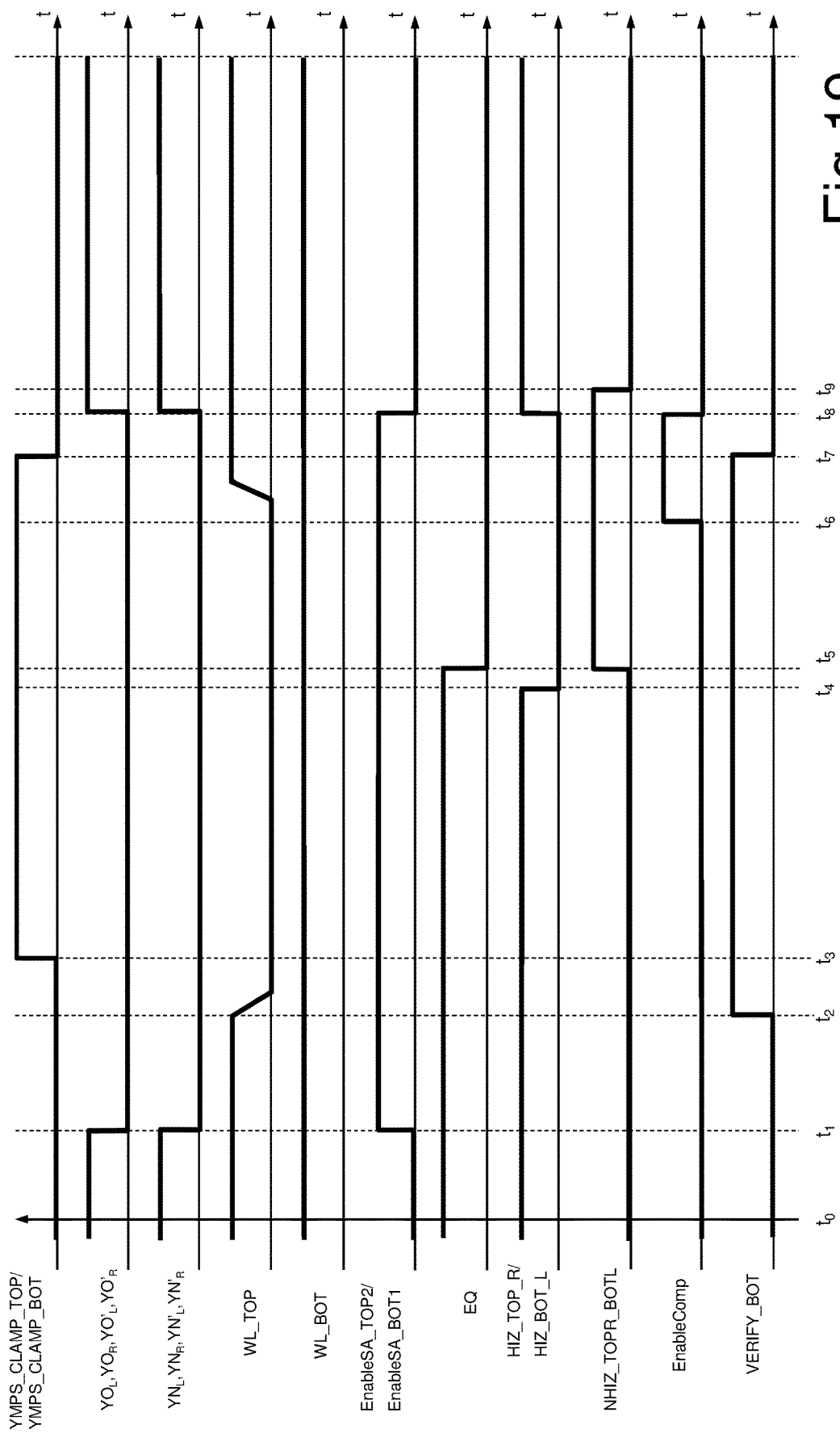

In addition, the control logic CL operates as illustrated in FIG. 13B and in FIG. 19:

the top voltage-clamp signal YMPS_CLAMP_TOP and the bottom voltage-clamp signal YMPS_CLAMP_BOT follow the same pattern as the voltage-clamp signal YMPS_CLAMP illustrated in FIG. 6A, except for the fact that they switch to "1" at the instant $t_3$, instead of at the instant $t_2$;

the local-column-decoding signals $YO_L$, $YO_R$, $YO_L'$, $YO_R'$ have the same pattern as the one illustrated in FIG. 6B;

the main-column-decoding signals $YN_L$, $YN_R$, $YN_L'$, $YN_R'$ have the same pattern as the one illustrated in FIG. 6C;

the wordline signal WL_TOP follows the same pattern as the wordline signal $S_{WL}$ illustrated in FIG. 6D, except for the fact that it switches to "0" at the instant $t_2$ instead of at the instant $t_3$; instead, the wordline signal WL_BOT remains equal to "1";

the signals EnableSA_TOP2 and EnableSA_BOT1 follow the same pattern as the signal EnableSA illustrated in FIG. 6E;

the equilibrium signal EQ continues to have the same pattern as the one illustrated in FIG. 6F;

the second top coupling signal HIZ_TOP_R and the first bottom coupling signal HIZ_BOT_L follow the same pattern as the coupling signal HIZ illustrated in FIG. 6G;

the signal NHIZ_TOPR_BOTL follows the same pattern as the reading signal NHIZ illustrated in FIG. 6H;

the signal EnableComp follows the same pattern described with reference to FIG. 12; and the signal VERIFY_BOT has a value equal to "0" at the instant $t_0$ and switches to "1" at the instant $t_2$, maintaining the value up to the instant $t_7$; in this way, the second reference generator 502 remains on during the time interval $t_2$-$t_7$.

Figure 20:
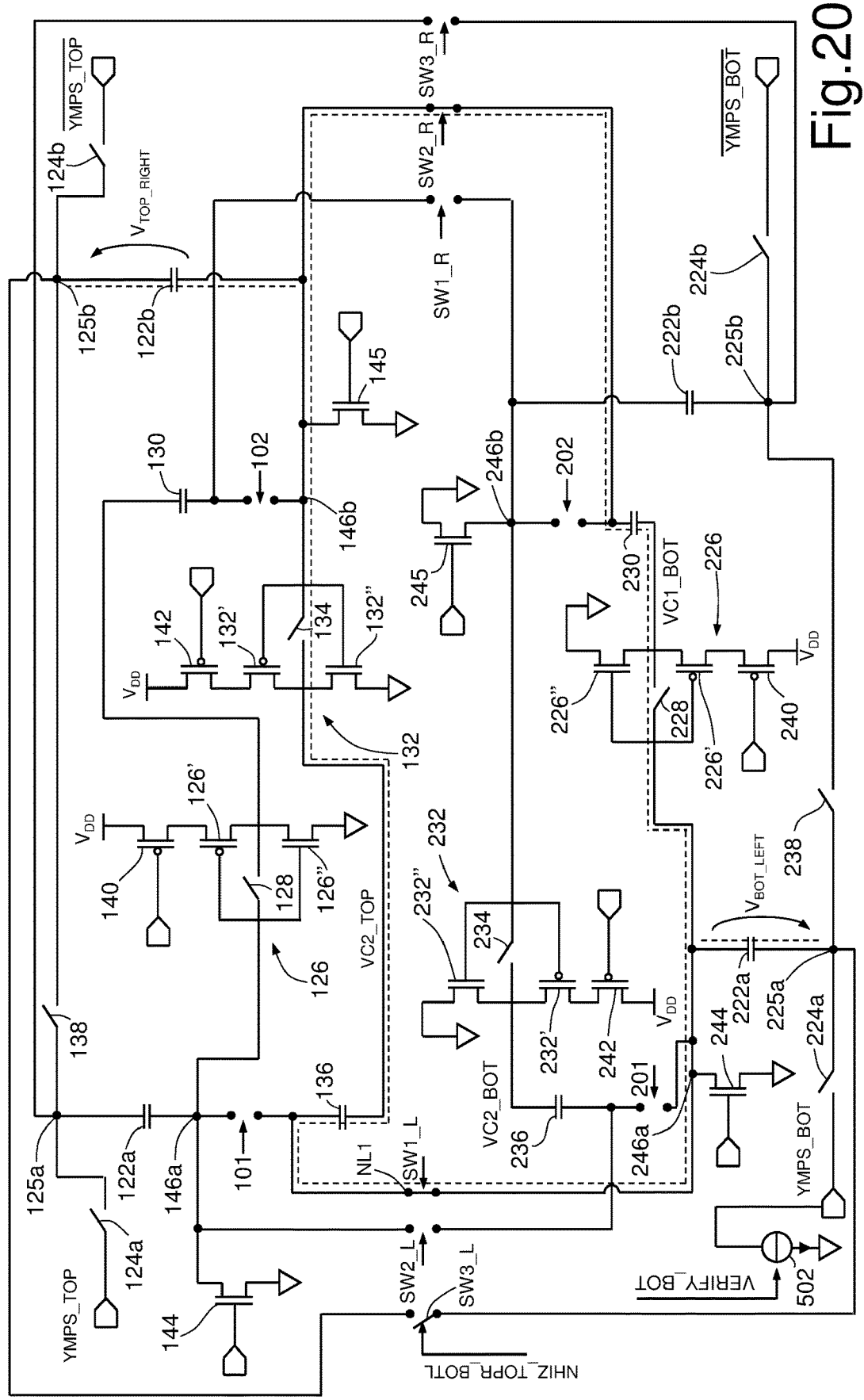

In practice, as may be seen in FIG. 20, the second inverter 132 and the second compensation capacitor 136 of the sense amplifier 146 of the top reading stage 117 and the first inverter 226 and the first compensation capacitor 230 of the sense amplifier 246 of the bottom reading stage 217 form a second aggregated latch structure, operation of which is similar to that of the first aggregated latch structure, except for the differences outlined in what follows.

The inputs of the second aggregated latch structure are represented by the second input 146b of the sense amplifier 146 of the top reading stage 117 and by the first input 246a of the sense amplifier 246 of the bottom reading stage 217.

In addition, coupling of the second top memory cell 3" to the local bitline $BL_R\langle j\rangle$ and to the corresponding main bitline $MBL_R$, as well as to the second input 117b of the top reading stage 117 is carried out in the same way and with the same timing with which the first bottom memory cell 3''' is coupled to the local bitline $BL_L\langle j\rangle'$ and to the corresponding main bitline $MBL_L'$, as well as to the first input 217a of the bottom reading stage 217. The capacitance seen from the first input 217a of the bottom reading stage 217 is thus substantially equal to the capacitance seen from the second input 117b of the top reading stage 117.

At the instant $t_4$, there thus appears a voltage difference between the second input 117b of the top reading stage 117 and the first input 217a of the bottom reading stage 217, and thus between the inputs of the second aggregated latch structure. This voltage difference depends upon the difference between the reference current and the current that flows in the second top memory cell 3", the latter current being a function of the datum stored in the second top memory cell 3". The difference of potential present across the second coupling capacitor 222a of the top reading stage 117 and the first coupling capacitor 222a of the bottom reading stage 217 (the voltages of which are denoted, respectively, by $V_{TOP\_RIGHT}$ and $V_{BOT\_LEFT}$ in FIG. 20) is thus due to the difference between the current that traverses the second top memory cell 3" and the reference current. This difference of potential perturbs the condition of metastable equilibrium of the second aggregated latch structure and induces a switching thereof according to the sign of the aforesaid difference of potential. The switching causes the voltages VC2_TOP and VC1_BOT present on the output terminals, respectively, of the second inverter 132 of the sense amplifier 146 of the top reading stage 117 and of the first inverter 226 of the sense amplifier 246 of the bottom reading stage 217 to assume complementary logic values, which depend upon the difference between the current that flows in the second top memory cell 3" and the reference current. Since, as mentioned previously, the signals VC1, VC2 present on the output of the multiplexing stage 600 are, respectively, equal to the signals VC1_BOT and VC2_TOP, it is found that the signal DataSense, at output from the comparison stage 602, represents the comparison between the current that traverses the second top memory cell 3" and the reference current. In other words, the signal DataSense represents a signal of single-ended reading of the second top memory cell 3".

Once again with reference to the case TOPR-BOTL, it may be noted how the second aggregated latch structure, the coupling switches 124b, 224a, and the additional switch SW3_L operate in the same way as what has been described, for example, with reference to the latch structure formed by the sense amplifier 146 of the top reading stage 117, to the equilibrium switches 124a, 124b, and to the reading switch 138, in the case referred to as TOP-TOP.

In a way similar to what has been described with reference to the case TOPR-BOTL, the control logic CL may issue a command for single-ended reading of the first bottom memory cell 3''' (case referred to as BOTL-TOPR in FIGS. 13A, 13B), as is now described with reference just to the differences with respect to the case TOPR-BOTL.

Figure 21:
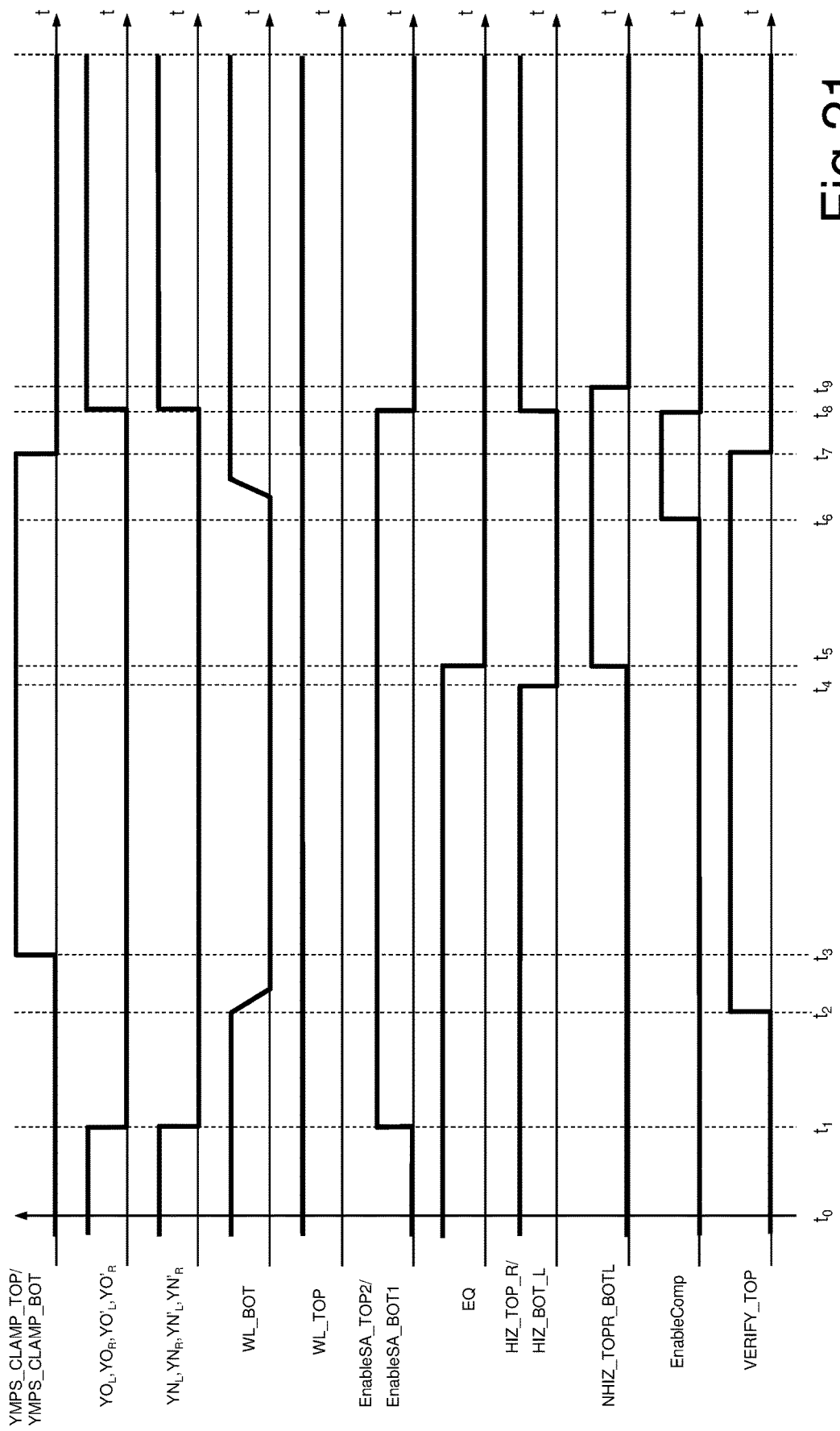
Figure 22:
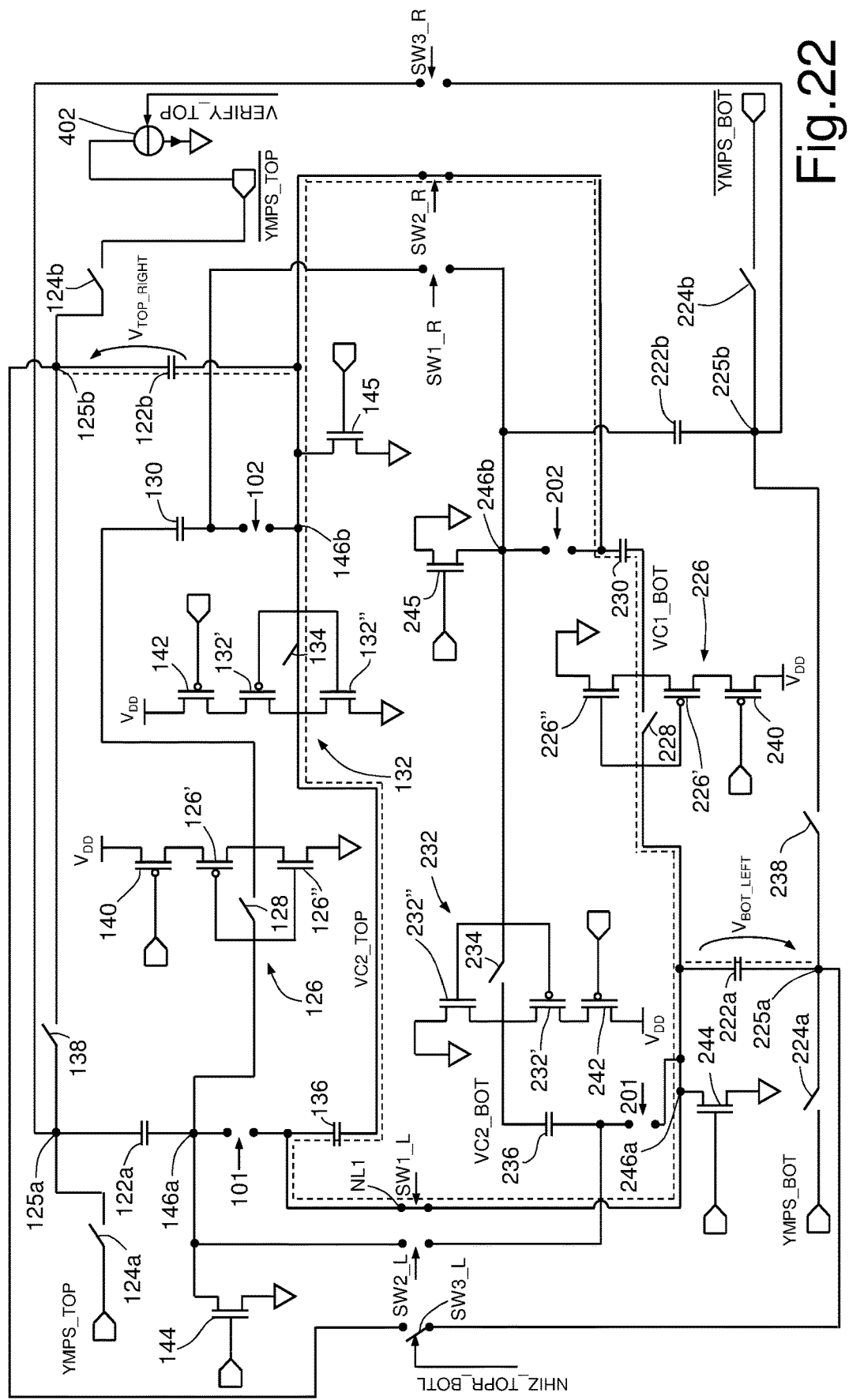

In detail, as emerges clearly from FIGS. 13A, 13B and FIG. 21, the following applies:

the signal VERIFY_TOPR is equal to "1", so that the first reference generator 402 is connected to the node YMPS_TOP, as illustrated in FIG. 22;

the signal VERIFY_BOTL is equal to "0", so that the second reference generator 502 is disconnected from the node YMPS_BOT;

the signal VERIFY_BOT is equal to "0", so that the second reference generator 502 is off;

the signal VERIFY_TOP follows the same pattern as the signal VERIFY_BOT illustrated in FIG. 19; and the signals WL_TOP and WL_BOT have pattern reversed with respect to what is illustrated in FIG. 19.

Figure 23:
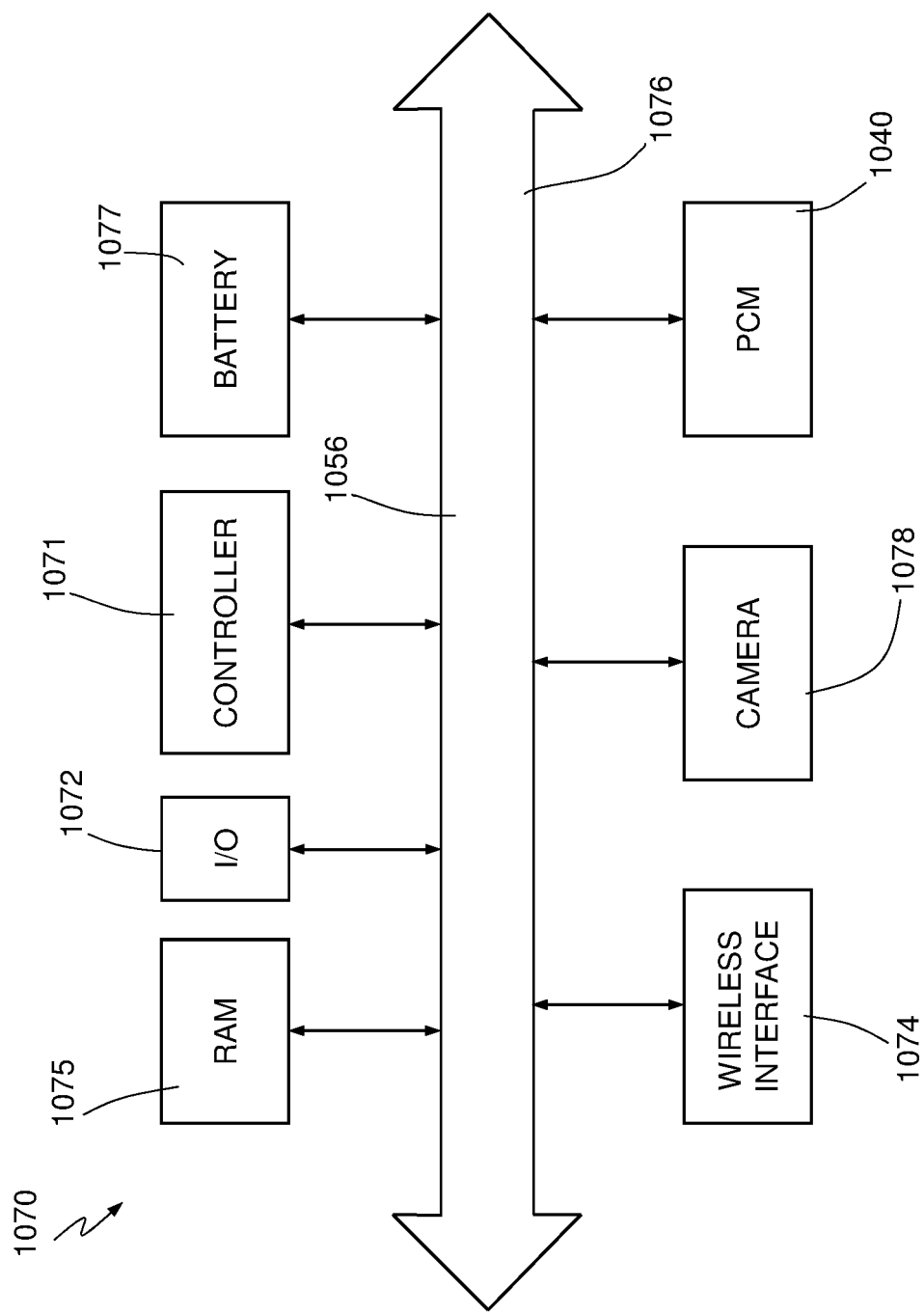
FIG. 23 is a block diagram of a possible electronic apparatus that incorporates the present device.

The present PCM device 100 lends itself to a wide range of applications. For instance, FIG. 23 illustrates a portion of an electronic apparatus 1070, which may, for example, be: a PDA (personal digital assistant); a portable or fixed computer, possibly with capacity for wireless data transfer; a cell phone; a digital audio player; a photographic camera or a camcorder; or other devices capable of processing, storing, transmitting, and receiving information.

In detail, the electronic apparatus 1070 includes: a controller 1071 (for example provided with a microprocessor, a DSP, or a microcontroller); an input/output device 1072 (for example, provided with a keypad and a display), for input and display of data; the PCM device (here designated by 1040) provided with the array 2 of memory cells 3 of the phase-change type described previously; a wireless interface 1074, for example an antenna, for transmitting and receiving data through a wireless radiofrequency communication network; and a RAM 1075. All the components of the electronic apparatus 1070 are coupled through a bus 1076. A battery 1077 may be used as electrical-supply source in the electronic apparatus 1070, which may further be provided with a photographic camera or videocamera or camcorder 1078. Further, the controller 1071 may control the PCM device 1040, for example by co-operating with the control logic CL.

The advantages that the present memory device affords emerge clearly from the foregoing description.

In detail, the present memory device enables switching between different reading modes, and in particular between a differential reading mode and a single-ended reading mode, maintaining capacitive balancing.

Finally, it is clear that modifications and variations may be made to the system described and illustrated herein, without thereby departing from the scope of the present disclosure.

For instance, the timing may differ from what has been described.

It is further possible for the selectors to be of a type different from what has been described. For instance, the selectors may be formed by MOS transistors.

It is further possible for the voltage-clamp switches to be absent; in this case, the local-column-decoding signals YO and the main-column-decoding signals YN switch at different instants.

What is claimed is:

1. A memory device, comprising:
   a first sector and a second sector of an array of memory cells, wherein each of the first sector and the second sector is associated with a respective selector and a respective phase-change element configured to have a first value of resistance or a second value of resistance associated to corresponding logic data, wherein the first sector comprises:
   a first top memory cell and a second top memory cell each coupled to a top wordline and, respectively, to a first top local bitline and a second top local bitline; and a first top main bitline and a second top main bitline coupled, respectively, to the first top local bitline and the second top local bitline; and wherein the second sector comprises:
- a first bottom memory cell and a second bottom memory cell each coupled to a bottom wordline and, respectively, to a first bottom local bitline and a second bottom local bitline; and
- a first bottom main bitline and a second bottom main bitline coupled, respectively, to the first bottom local bitline and the second bottom local bitline;

the memory device further comprising:
- a controller and a reading circuit arranged between the first sector and the second sectors, the reading circuit comprising a top reading stage comprising a first top input node and a second top input node, and a bottom reading stage comprising a first bottom input node and a second bottom input node;
- a top circuitry configured to be controlled so as to charge the first top input node and the second top input node and couple the first top input node and the second top input node respectively to the first top memory cell and the second top memory cell, respectively through the first top local bitline and the first top main bitline, and through the second top local bitline and the second top main bitline;
- a bottom circuitry configured to be controlled so as to charge the first bottom input node and the second bottom input node and couple the first bottom input node and the second bottom input node respectively to the first bottom memory cell and the second bottom memory cell, respectively through the first bottom local bitline and the first bottom main bitline, and through the second bottom local bitline and the second bottom main bitline; and
- a reference generator configured to be driven by the controller so as to couple to the first top input node or the second top input node to the first bottom input node or the second bottom input node.

2. The memory device of claim 1, wherein the top reading stage comprises:
- a top sense amplifier comprising a first input, a second input, a first top branch, and a second top branch, the first top branch being arranged between the first input of the top sense amplifier and a first top internal node and comprising a first top inverter and a first top compensation capacitor coupled together, the second top branch being arranged between the second input of the top sense amplifier and a second top internal node and comprising a second top inverter and a second top compensation capacitor coupled together, the top sense amplifier further comprising a first top routing switch arranged between the second top internal node and the first input of the top sense amplifier, and a second top routing switch arranged between the first top internal node and the second input of the top sense amplifier;
- a first top coupling capacitor, coupled to the first input of the top sense amplifier and to a first top intermediate node;
- a second top coupling capacitor, coupled to the second input of the top sense amplifier and to a second top intermediate node; and
- a first top coupling switch and a second top coupling switch configured to be controlled so as to couple, respectively, the first top intermediate node and the second top intermediate node to the first top input node and to the second top input node, respectively, and a top reading switch configured to be controlled so as to couple together the first top intermediate node and the second top intermediate node.

3. The memory device of claim 2, wherein the bottom reading stage comprises:
- a bottom sense amplifier comprising a respective first input, a respective second input, a first bottom branch, and a second bottom branch, the first bottom branch being arranged between the first input of the bottom sense amplifier and a first bottom internal node and comprising a first bottom inverter and a first bottom compensation capacitor coupled together, the second bottom branch being arranged between the second input of the bottom sense amplifier and a second bottom internal node and comprising a second bottom inverter and a second bottom compensation capacitor coupled together, the bottom sense amplifier further comprising a first bottom routing switch arranged between the second bottom internal node and the first input of the bottom sense amplifier, and a second bottom routing switch arranged between the first bottom internal node and the second input of the bottom sense amplifier;
- a first bottom coupling capacitor coupled to the first input of the bottom sense amplifier and to a first bottom intermediate node;
- a second bottom coupling capacitor coupled to the second input of the bottom sense amplifier and to a second bottom intermediate node; and
- a first bottom coupling switch and a second bottom coupling switch configured to be controlled so as to couple, respectively, the first bottom intermediate node and the second bottom intermediate node to the first bottom input node and to the second bottom input node, respectively, and a bottom reading switch configured to be controlled so as to couple together the first bottom intermediate node and the second bottom intermediate node.

4. The memory device of claim 3, further comprising:
- a first additional switch arranged between the first top internal node and the second input of the bottom sense amplifier;
- a second additional switch arranged between the second top internal node and the first input of the bottom sense amplifier;
- a third additional switch arranged between the first bottom internal node and the second input of the top sense amplifier;
- a fourth additional switch arranged between the second bottom internal node and the first input of the top sense amplifier; and
- a fifth additional switch arranged between the first top intermediate node and the second bottom intermediate node, wherein the controller is configured to operate in a first operating mode driving the first, second, third, and fourth additional switches so as to decouple the top sense amplifier and the bottom sense amplifier, and wherein the controller executes a first group of operations or a second group of operations, the first group of operations comprising:
  - driving the first and second top routing switches so as to couple the first and second top branches and form a first loop circuit;
  - selecting the top wordline and driving the top circuitry so as to discharge the first and second top input nodes by currents that flow, respectively, in the first and second top memory cells and depend upon the values of resistance of the respective phase-change elements; and driving the first and second top coupling switches so as to discharge the first and second top coupling capacitors as a function of discharge, respectively, of the first and second top input nodes, and subsequently driving the top reading switch so as to couple together the first and second top intermediate nodes and cause evolution of the first loop circuit into a respective first condition of equilibrium or second condition of equilibrium, as a function of a difference of charge present between the first and second top coupling capacitors;

and wherein the second group of operations comprises:

driving the first and second bottom routing switches so as to couple the first and second bottom branches and form a second loop circuit;

selecting the bottom wordline and driving the bottom circuitry so as to discharge the first and second bottom input nodes by currents that flow, respectively, in the first and second bottom memory cells and depend upon the values of resistance of the respective phase-change elements; and driving the first and second bottom coupling switches so as to discharge the first and second bottom coupling capacitors as a function of discharge, respectively, of the first and second bottom input nodes, and subsequently driving the bottom reading switch so as to couple together the first and second bottom intermediate nodes and cause evolution of the second loop circuit into a respective first condition of equilibrium or second condition of equilibrium, as a function of a difference of charge present between the first and second bottom coupling capacitors;

and wherein the controller is further configured to operate at least in a second operating mode driving the first and second top routing switches so as to decouple the first and second top branches, and driving the first and second bottom routing switches so as to decouple the first and second bottom branches, and executing a third group of operations comprising:

driving the first and fourth additional switches so as to couple the first top branch and the second bottom branch and form a third loop circuit;

selecting the top wordline and driving the top circuitry so as to discharge the first top input node by the current that flows in the first top memory cell and that depends upon the value of resistance of the respective phase-change element;

driving the bottom circuitry so as to couple the second bottom input node to the second bottom local bitline and to the second bottom main bitline;

deselecting the bottom wordline;

coupling the reference generator to the second bottom input node and discharging the second bottom input node by a reference current; and driving the first top coupling switch and the second bottom coupling switch so as to discharge the first top coupling capacitor and the second bottom coupling capacitor as a function of discharge, respectively, of the first top input node and of the second bottom input node, and subsequently driving the fifth additional switch so as to couple together the first top intermediate node and the second bottom intermediate node and cause evolution of the third loop circuit into a respective first condition of equilibrium or second condition of equilibrium, as a function of a difference of charge present between the first top coupling capacitor and the second bottom coupling capacitor.

5. The memory device according to claim 4, further comprising a sixth additional switch arranged between the second top intermediate node and the first bottom intermediate node; and wherein the controller is further configured to operate further in a third operating mode driving the first and second top routing switches so as to decouple the first and second top branches and driving the first and second bottom routing switches so as to decouple the first and second bottom branches, and driving the second and third additional switches so as to couple the second top branch and the first bottom branch and form a fourth loop circuit, and executing a fourth group of operations comprising:

selecting the top wordline and driving the top circuitry so as to discharge the second top input node by the current that flows in the second top memory cell and that depends upon the value of resistance of the respective phase-change element;

driving the bottom circuitry so as to couple the first bottom input node to the first bottom local bitline and to the first bottom main bitline;

deselecting the bottom wordline;

coupling the reference generator to the first bottom input node and discharging the first bottom input node by the reference current; and driving the second top coupling switch and the first bottom coupling switch so as to discharge the second top coupling capacitor and the first bottom coupling capacitor as a function of discharge, respectively, of the second top input node and of the first bottom input node, and subsequently driving the sixth additional switch so as to couple together the second top intermediate node and the first bottom intermediate node and cause evolution of the fourth loop circuit into a respective first condition of equilibrium or second condition of equilibrium, as a function of a difference of charge present between the second top coupling capacitor and the first bottom coupling capacitor.

6. The memory device according to claim 5, wherein, when the controller operates in the second operating mode, the controller is configured to execute alternatively the third group of operations or a fifth group of operations comprising:

selecting the bottom wordline and driving the bottom circuitry so as to discharge the second bottom input node by the current that flows in the second bottom memory cell and that depends upon the value of resistance of the respective phase-change element;

driving the top circuitry so as to couple the first top input node to the first top local bitline and to the first top main bitline;

deselecting the top wordline;

coupling the reference generator to the first top input node and discharging the first top input node by the reference current; and driving the first top coupling switch and the second bottom coupling switch so as to discharge the first top coupling capacitor and the second bottom coupling capacitor as a function of discharge, respectively, of the first top input node and of the second bottom input node, and subsequently driving the fifth additional switch so as to couple together the first top intermediate node and the second bottom intermediate node and cause evolution of the third loop circuit into the respective first condition of equilibrium or second condition of equilibrium, as a function of the difference of charge present between the first top coupling capacitor and the second bottom coupling capacitor.

7. The memory device according to claim 6, wherein, when the controller operates in the third operating mode, the controller is configured to execute alternatively the fourth group of operations or a sixth group of operations comprising:

selecting the bottom wordline and driving the bottom circuitry so as to discharge the first bottom input node by the current that flows in the first bottom memory cell and that depends upon the value of resistance of the respective phase-change element;

driving the top circuitry so as to couple the second top input node to the second top local bitline and to the second top main bitline;

deselecting the top wordline;

coupling the reference generator to the second top input node and discharging the second top input node by the reference current; and driving the second top coupling switch and the first bottom top coupling switch so as to discharge the second top coupling capacitor and the first bottom coupling capacitor as a function of discharge, respectively, of the second top input node and of the first bottom input node, and subsequently driving the sixth additional switch so as to couple together the second top intermediate node and the first bottom intermediate node and cause evolution of the fourth loop circuit into the respective first condition of equilibrium or second condition of equilibrium, as a function of the difference of charge present between the second top coupling capacitor and the first bottom coupling capacitor.

8. The memory device according to claim 7, further comprising a first supply line and a second supply line, which are configured to be set at a supply voltage and are coupled, respectively, to the top circuitry and to the bottom circuitry; and wherein the first and second top local bitlines form, respectively, a first top parasitic capacitor and a second top parasitic capacitor, and the first and second top main bitlines form, respectively, a third top parasitic capacitor and a fourth top parasitic capacitor; and wherein the first and second bottom local bitlines form, respectively, a first bottom parasitic capacitor and a second bottom parasitic capacitor, and the first and second bottom main bitlines form, respectively, a third bottom parasitic capacitor and a fourth bottom parasitic capacitor; and wherein the top circuitry is configured to be controlled by the controller so as to:

charge the first and third top parasitic capacitors at the supply voltage, couple the first top input node to the first and third top parasitic capacitors, and discharge, when the top wordline is selected, the first and third top parasitic capacitors through the first top memory cell; and charge the second and fourth top parasitic capacitors at the supply voltage, couple the second top input node to the second and fourth top parasitic capacitors, and discharge, when the top wordline is selected, the second and fourth top parasitic capacitors through the second top memory cell;

and wherein the bottom circuitry is configured to be controlled by the controller so as to:

charge the first and third bottom parasitic capacitors at the supply voltage, couple the first bottom input node to the first and third bottom parasitic capacitors, and discharge, when the bottom wordline is selected, the first and third bottom capacitors through the first bottom memory cell; and charge the second and fourth bottom parasitic capacitors at the supply voltage, couple the second bottom input node to the second and fourth bottom parasitic capacitors, and discharge, when the top wordline is selected, the second and fourth bottom parasitic capacitors through the second bottom memory cell.

9. The memory device according to claim 8, wherein the top circuitry comprises:

a first top local switch arranged between the first top local bitline and the first top main bitline;

a first top precharge switch arranged between the first top main bitline and the first supply line;

a first top main selection switch arranged between the first top main bitline and the first top input node;

a second top local switch arranged between the second top local bitline and the second top main bitline;

a second top precharge switch arranged between the second top main bitline and the first supply line;

a second top main selection switch arranged between the second top main bitline and the second top input node;

a first top voltage-clamp switch arranged between the first supply line and the first top input node; and a second top voltage-clamp switch arranged between the first supply line and the second top input node;

and wherein the bottom circuitry comprises:

a first bottom local switch arranged between the first bottom local bitline and the first bottom main bitline;

a first bottom precharge switch arranged between the first bottom main bitline and the second supply line;

a first bottom main selection switch arranged between the first bottom main bitline and the first bottom input node;

a second bottom local switch arranged between the second bottom local bitline and the second bottom main bitline;

a second bottom precharge switch arranged between the second bottom main bitline and the second supply line;

a second bottom main selection switch arranged between the second bottom main bitline and the second bottom input node;

a first bottom voltage-clamp switch arranged between the second supply line and the first bottom input node; and a second bottom voltage-clamp switch arranged between the second supply line and the second bottom input node;

and wherein the first group of operations executed by the controller comprises:

closing, at a corresponding first instant, the first and second top precharge switches and charging the third and fourth top parasitic capacitors at the supply voltage;

at a corresponding second instant subsequent to the corresponding first instant, opening the first and second top precharge switches, closing the first and second top main selection switches so as to couple the first and second top main bitlines to the first top input node and to the second top input node, respectively, and further closing the first and second top local switches and charging the first and second top parasitic capacitors using the voltage of the third and fourth top parasitic capacitors, respectively; and keeping the first and second top voltage-clamp switches closed up to a corresponding third instant subsequent to the corresponding second instant;

selecting the top wordline at a corresponding fourth instant subsequent to the corresponding third instant; and opening the first and second top coupling switches at a corresponding fifth instant subsequent to the fourth instant;

and wherein the second group of operations executed by the controller comprises:

closing, at a corresponding first instant, the first and second bottom precharge switches and charging the third and fourth bottom parasitic capacitors at the supply voltage;

at a corresponding second instant subsequent to the corresponding first instant, opening the first and second bottom precharge switches, closing the first and second bottom main selection switches, so as to couple the first and second bottom main bitlines to the first bottom input node and to the second bottom input node, respectively, and further closing the first and second bottom local switches and charging the first and second bottom parasitic capacitors using the voltage of the third and fourth bottom parasitic capacitors, respectively;

keeping the first and second bottom voltage-clamp switches closed up to a corresponding third instant subsequent to the corresponding second instant;

selecting the bottom wordline at a corresponding fourth instant subsequent to the corresponding third instant;

opening the first and second bottom coupling switches at a corresponding fifth instant subsequent to the fourth instant;

and wherein each one of the third and fifth groups of operations executed by the controller comprises:

closing, at a corresponding first instant, the first top precharge switch and the second bottom precharge switch and charging the third top parasitic capacitor and the fourth bottom parasitic capacitor at the supply voltage;

at a corresponding second instant subsequent to the corresponding first instant, opening the first top precharge switch and the second bottom precharge switch, closing the first top main selection switch and the second bottom main selection switch, so as to couple the first top main bitline and the second bottom main bitline to the first top input node and to the second bottom input node, respectively, and further closing the first top local switch and the second bottom local switch and charging the first top parasitic capacitor and the second bottom parasitic capacitor using the voltage of the third top parasitic capacitor and of the fourth bottom parasitic capacitor, respectively; and keeping the first top voltage-clamp switch and the second bottom voltage-clamp switch closed up to a corresponding third instant subsequent to the corresponding second instant;

at a corresponding fourth instant prior to the corresponding third instant, selecting the top wordline, in the case of the third group of operations, or selecting the bottom wordline, in the case of the fifth group of operations; and opening the first top coupling switch and the second bottom coupling switch at a corresponding fifth instant subsequent to the third instant;

and wherein each one of the fourth and sixth groups of operations executed by the controller comprises:

closing, at a corresponding first instant, the second top precharge switch and the first bottom precharge switch, and charging the fourth top parasitic capacitor and the third bottom parasitic capacitor at the supply voltage;

at a corresponding second instant subsequent to the corresponding first instant, opening the second top precharge switch and the first bottom precharge switch, closing the second top main selection switch and the first bottom main selection switch, so as to couple the second top main bitline and the first bottom main bitline to the second top input node and, respectively, to the first bottom input node, and further closing the second top local switch and the first bottom local switch and charging the second top parasitic capacitor and the first bottom parasitic capacitor using, respectively, the voltage of the fourth top parasitic capacitor and of the third bottom parasitic capacitor;

keeping closed the second top voltage-clamp switch and the first bottom voltage-clamp switch up to a corresponding third instant subsequent to the corresponding second instant;

at a corresponding fourth instant prior to the corresponding third instant, selecting the top wordline, in the case of the fourth group of operations, or else selecting the bottom wordline, in the case of the sixth group of operations; and opening the second top coupling switch and the first bottom coupling switch at a corresponding fifth instant subsequent to the third instant.

10. The memory device according to claim 3, further comprising an output stage configured to select a pair of electrical quantities from among the electrical quantities present on output terminals of the first and second top inverters and of the first and second bottom inverters.

11. The memory device according claim 1, wherein the first and second bottom memory cells are arranged symmetrically with respect to the first and second top memory cells, respectively.

12. The memory device according to claim 1, wherein the first and second sectors are the same as one another.

13. An electronic apparatus comprising:
a memory device according to claim 1;
a further controller; and
a bus configured to electrically couple the further controller and the memory device.

14. A method for reading a memory device comprising a first sector and a second sector of an array of memory cells, each of the first sector and the second sector comprising a respective selector and a phase-change element configured to have a first value of resistance or a second value of resistance associated to corresponding logic data; the first sector comprising:
a first top memory cell and a second top memory cell, coupled to a top wordline and, respectively, to a first top local bitline and a second top local bitline; and
a first top main bitline and a second top main bitline coupled, respectively, to the first and second top local bitlines;

the second sector comprising:
a first bottom memory cell and a second bottom memory cell coupled to a bottom wordline and, respectively, to a first bottom local bitline and a second bottom local bitline; and
a first bottom main bitline and a second bottom main bitline coupled, respectively, to the first and second bottom local bitlines;

the memory device further comprising a reading circuit arranged between the first and second sectors and including a top reading stage comprising a first top input node and a second top input node, and a bottom reading stage comprising a first bottom input node and a second bottom input node, the memory device further comprising:

a top circuitry configured to be controlled so as to charge the first and second top input nodes and couple the first and second top input nodes respectively to the first and second top memory cells, respectively through the first top local bitline and the first top main bitline, and through the second top local bitline and the second top main bitline;

a bottom circuitry configured to be controlled so as to charge the first and second bottom input nodes and couple the first and second bottom input nodes respectively to the first and second bottom memory cells, respectively through the first bottom local bitline and the first bottom main bitline, and through the second bottom local bitline and the second bottom main bitline;

a reference generator configured to be driven so as to couple to the first top input node or the second top input node or else to the first bottom input node or the second bottom input node;

the top reading stage comprising:

a top sense amplifier comprising a first input, a second input, a first top branch, and a second top branch, the first top branch being arranged between the first input of the top sense amplifier and a first top internal node and comprising a first top inverter and a first top compensation capacitor coupled together, the second top branch being arranged between the second input of the top sense amplifier and a second top internal node and comprising a second top inverter and a second top compensation capacitor coupled together, the top sense amplifier further comprising a first top routing switch arranged between the second top internal node and the first input of the top sense amplifier, and a second top routing switch arranged between the first top internal node and the second input of the top sense amplifier;

a first top coupling capacitor, coupled to the first input of the top sense amplifier and to a first top intermediate node;

a second top coupling capacitor, coupled to the second input of the top sense amplifier and to a second top intermediate node;

a first top coupling switch and a second top coupling switch configured to be controlled so as to couple, respectively, the first and second top intermediate nodes to the first and second top input nodes, respectively, and a top reading switch configured to be controlled so as to couple together the first and second top intermediate nodes;

the bottom reading stage comprising:

a bottom sense amplifier comprising a respective first input, a respective second input, a first bottom branch, and a second bottom branch, the first bottom branch being arranged between the first input of the bottom sense amplifier and a first bottom internal node and including a first bottom inverter and a first bottom compensation capacitor coupled together, the second bottom branch being arranged between the second input of the bottom sense amplifier and a second bottom internal node and including a second bottom inverter and a second bottom compensation capacitor coupled together, the bottom sense amplifier further comprising a first bottom routing switch arranged between the second bottom internal node and the first input of the bottom sense amplifier, and a second bottom routing switch arranged between the first bottom internal node and the second input of the bottom sense amplifier;

a first bottom coupling capacitor coupled to the first input of the bottom sense amplifier and to a first bottom intermediate node;

a second bottom coupling capacitor coupled to the second input of the bottom sense amplifier and to a second bottom intermediate node; and a first bottom coupling switch and a second bottom coupling switch configured to be controlled so as to couple, respectively, the first and second bottom intermediate nodes to the first bottom input node and to the second bottom input node, respectively, and a bottom reading switch configured to be controlled so as to couple together the first and second bottom intermediate nodes;

the memory device further comprising:

a first additional switch arranged between the first top internal node and the second input of the bottom sense amplifier;

a second additional switch arranged between the second top internal node and the first input of the bottom sense amplifier;

a third additional switch arranged between the first bottom internal node and the second input of the top sense amplifier;

a fourth additional switch arranged between the second bottom internal node and the first input of the top sense amplifier; and a fifth additional switch arranged between the first top intermediate node and the second bottom intermediate node;

the reading method comprising executing a first set of operations comprising driving the first, second, third, and fourth additional switches so as to decouple the top sense amplifier and the bottom sense amplifier, and executing a first group of operations or a second group of operations, the first group of operations comprising:

driving the first and second top routing switches so as to couple the first and second top branches and form a first loop circuit;

selecting the top wordline and driving the top circuitry so as to discharge the first and second top input nodes by currents that flow, respectively, in the first and second top memory cells and that depend upon the values of resistance of the respective phase-change elements; and driving the first and second top coupling switches so as to discharge the first and second top coupling capacitors as a function of discharge, respectively, of the first and second top input nodes, and subsequently driving the top reading switch so as to couple together the first and second top intermediate nodes and cause evolution of the first loop circuit into a respective first condition of equilibrium or second condition of equilibrium, as a function of a difference of charge present between the first and second top coupling capacitors;

and wherein the second group of operations comprises:

driving the first and second bottom routing switches so as to couple the first and second bottom branches and form a second loop circuit;

selecting the bottom wordline and driving the bottom circuitry so as to discharge the first and second bottom input nodes by currents that flow, respectively, in the first and second bottom memory cells and depend upon the values of resistance of the respective phase-change elements; and driving the first and second bottom coupling switches so as to discharge the first and second bottom coupling capacitors as a function of discharge, respectively, of the first and second bottom input nodes, and subsequently driving the bottom reading switch so as to couple together the first and second bottom intermediate nodes and cause evolution of the second loop circuit into a respective first condition of equilibrium or second condition of equilibrium, as a function of a difference of charge present between the first and second bottom coupling capacitors;

the reading method further comprising executing at least one second set of operations comprising driving the first and second top routing switches so as to decouple the first and second top branches, driving the first and second bottom routing switches so as to decouple the first and second bottom branches, and executing a third group of operations comprising:

driving the first and fourth additional switches so as to couple the first top branch and the second bottom branch and form a third loop circuit;

selecting the top wordline and driving the top circuitry so as to discharge the first top input node by the current that flows in the first top memory cell and that depends upon the value of resistance of the respective phase-change element;

driving the bottom circuitry so as to couple the second bottom input node to the second bottom local bitline and to the second bottom main bitline;

deselecting the bottom wordline;

coupling the reference generator to the second bottom input node and discharging the second bottom input node by a reference current; and driving the first top coupling switch and the second bottom coupling switch so as to discharge the first top coupling capacitor and the second bottom coupling capacitor as a function of discharge, respectively, of the first top input node and of the second bottom input node, and subsequently driving the fifth additional switch so as to couple together the first top intermediate node and the second bottom intermediate node and cause evolution of the third loop circuit into a respective first condition of equilibrium or second condition of equilibrium, as a function of a difference of charge present between the first top coupling capacitor and the second bottom coupling capacitor.

15. The reading method according to claim 14, wherein the memory device further comprises a sixth additional switch arranged between the second top intermediate node and the first bottom intermediate node, the reading method further comprising executing a third set of operations comprising driving the first and second top routing switches so as to decouple the first and second top branches, driving the first and second bottom routing switches so as to decouple the first and second bottom branches, and driving the second and third additional switches so as to couple the second top branch and the first bottom branch and form a fourth loop circuit, the third set of operations further comprising executing a fourth group of operations comprising:

selecting the top wordline and driving the top circuitry so as to discharge the second top input node by the current that flows in the second top memory cell and that depends upon the value of resistance of the respective phase-change element;

driving the bottom circuitry so as to couple the first bottom input node to the first bottom local bitline and to the first bottom main bitline;

deselecting the bottom wordline;

coupling the reference generator to the first bottom input node and discharging the first bottom input node by the reference current; and driving the second top coupling switch and the first bottom coupling switch so as to discharge the second top coupling capacitor and the first bottom coupling capacitor as a function of discharge, respectively, of the second top input node and of the first bottom input node, and subsequently driving the sixth additional switch so as to couple together the second top intermediate node and the first bottom intermediate node and cause evolution of the fourth loop circuit into a respective first condition of equilibrium or second condition of equilibrium, as a function of a difference of charge present between the second top coupling capacitor and the first bottom coupling capacitor.

16. The reading method according to claim 15, wherein the second set of operations comprises executing alternatively the third group of operations or else a fifth group of operations comprising:

selecting the bottom wordline and driving the bottom circuitry so as to discharge the second bottom input node by the current that flows in the second bottom memory cell and that depends upon the value of resistance of the respective phase-change element;

driving the top circuitry so as to couple the first top input node to the first top local bitline and to the first top main bitline;

deselecting the top wordline;

coupling the reference generator to the first top input node and discharging the first top input node by the reference current; and driving the first top coupling switch and the second bottom coupling switch so as to discharge the first top coupling capacitor and the second bottom coupling capacitor as a function of discharge, respectively, of the first top input node and of the second bottom input node, and subsequently driving the fifth additional switch so as to couple together the first top intermediate node and the second bottom intermediate node and cause evolution of the third loop circuit into the respective first condition of equilibrium or second condition of equilibrium, as a function of the difference of charge present between the first top coupling capacitor and the second bottom coupling capacitor.

17. The reading method according to claim 16, wherein the third set of operations comprises executing alternatively the fourth group of operations, or else a sixth group of operations comprising:

selecting the bottom wordline and driving the bottom circuitry so as to discharge the first bottom input node by the current that flows in the first bottom memory cell and that depends upon the value of resistance of the respective phase-change element;

driving the top circuitry so as to couple the second top input node to the second top local bitline and to the second top main bitline;

deselecting the top wordline;

coupling the reference generator to the second top input node and discharging the second top input node by the reference current; and driving the second top coupling switch and the first bottom coupling switch so as to discharge the second top coupling capacitor and the first bottom coupling capacitor as a function of discharge, respectively, of the second top input node and of the first bottom input node, and subsequently driving the sixth additional switch so as to couple together the second top intermediate node and the first bottom intermediate node and cause evolution of the fourth loop circuit into the respective first condition of equilibrium or second condition of equilibrium, as a function of the difference of charge present between the second top coupling capacitor and the first bottom coupling capacitor.

18. The reading method according to claim 17, wherein the memory device further comprises a first supply line and a second supply line configured to be set at a supply voltage and coupling, respectively, to the top circuitry and to the bottom circuitry, and wherein the first and second top local bitlines form, respectively, a first top parasitic capacitor and a second top parasitic capacitor, and the first and second top main bitlines form, respectively, a third top parasitic capacitor and a fourth top parasitic capacitor, and wherein the first and second bottom local bitlines form, respectively, a first bottom parasitic capacitor and a second bottom parasitic capacitor, and the first and second bottom main bitlines form, respectively, a third bottom parasitic capacitor and a fourth bottom parasitic capacitor, the reading method further comprising driving the top circuitry so as to:

charge the first and third top parasitic capacitors at the supply voltage, couple the first top input node to the first and third top parasitic capacitors, and discharge, when the top wordline is selected, the first and third top parasitic capacitors through the first top memory cell; and charge the second and fourth top parasitic capacitors at the supply voltage, couple the second top input node to the second and fourth top parasitic capacitors, and discharge, when the top wordline is selected, the second and fourth top parasitic capacitors through the second top memory cell;

the reading method further comprising driving the bottom circuitry so as to:

charge the first and third bottom parasitic capacitors at the supply voltage, couple the first bottom input node to the first and third bottom parasitic capacitors, and discharge, when the bottom wordline is selected, the first and third bottom parasitic capacitors through the first bottom memory cell; and charge the second and fourth bottom parasitic capacitors at the supply voltage, couple the second bottom input node to the second and fourth bottom parasitic capacitors, and discharge, when the top wordline is selected, the second and fourth bottom parasitic capacitors through the second bottom memory cell.

19. A phase change memory (PCM) device, comprising:
a first sector and a second sector of an array of memory cells, wherein each of the first sector and the second sector is associated with a respective selector and a respective phase-change element configured to have a first value of resistance or a second value of resistance associated to corresponding logic data, wherein the first sector comprises:
  a first top memory cell and a second top memory cell each coupled to a top wordline and, respectively, to a first top local bitline and a second top local bitline; and
  a first top main bitline and a second top main bitline coupled, respectively, to the first top local bitline and the second top local bitline; and wherein the second sector comprises:
  a first bottom memory cell and a second bottom memory cell each coupled to a bottom wordline and, respectively, to a first bottom local bitline and a second bottom local bitline, wherein the first and second bottom memory cells are arranged symmetrically with respect to the first and second top memory cells, respectively; and
  a first bottom main bitline and a second bottom main bitline coupled, respectively, to the first bottom local bitline and the second bottom local bitline;

the PCM device further comprising:
  a controller and a reading circuit arranged between the first sector and the second sectors, the reading circuit comprising a top reading stage comprising a first top input node and a second top input node, and a bottom reading stage comprising a first bottom input node and a second bottom input node;
  a top circuitry configured to be controlled so as to charge the first top input node and the second top input node and couple the first top input node and the second top input node respectively to the first top memory cell and the second top memory cell, respectively through the first top local bitline and the first top main bitline, and through the second top local bitline and the second top main bitline;
  a bottom circuitry configured to be controlled so as to charge the first bottom input node and the second bottom input node and couple the first bottom input node and the second bottom input node respectively to the first bottom memory cell and the second bottom memory cell, respectively through the first bottom local bitline and the first bottom main bitline, and through the second bottom local bitline and the second bottom main bitline; and
  a reference generator configured to be driven by the controller so as to couple to the first top input node or the second top input node to the first bottom input node or the second bottom input node;

wherein the top reading stage comprises:
  a top sense amplifier comprising a first input, a second input, a first top branch, and a second top branch, the first top branch being arranged between the first input of the top sense amplifier and a first top internal node and comprising a first top inverter and a first top compensation capacitor coupled together, the second top branch being arranged between the second input of the top sense amplifier and a second top internal node and comprising a second top inverter and a second top compensation capacitor coupled together, the top sense amplifier further comprising a first top routing switch arranged between the second top internal node and the first input of the top sense amplifier, and a second top routing switch arranged between the first top internal node and the second input of the top sense amplifier;
  a first top coupling capacitor, coupled to the first input of the top sense amplifier and to a first top intermediate node;
  a second top coupling capacitor, coupled to the second input of the top sense amplifier and to a second top intermediate node; and
  a first top coupling switch and a second top coupling switch configured to be controlled so as to couple, respectively, the first top intermediate node and the second top intermediate node to the first top input node and to the second top input node, respectively, and a top reading switch configured to be controlled so as to couple together the first top intermediate node and the second top intermediate node; and wherein the bottom reading stage comprises:

a bottom sense amplifier comprising a respective first input, a respective second input, a first bottom branch, and a second bottom branch, the first bottom branch being arranged between the first input of the bottom sense amplifier and a first bottom internal node and comprising a first bottom inverter and a first bottom compensation capacitor coupled together, the second bottom branch being arranged between the second input of the bottom sense amplifier and a second bottom internal node and comprising a second bottom inverter and a second bottom compensation capacitor coupled together, the bottom sense amplifier further comprising a first bottom routing switch arranged between the second bottom internal node and the first input of the bottom sense amplifier, and a second bottom routing switch arranged between the first bottom internal node and the second input of the bottom sense amplifier;

a first bottom coupling capacitor coupled to the first input of the bottom sense amplifier and to a first bottom intermediate node;

a second bottom coupling capacitor coupled to the second input of the bottom sense amplifier and to a second bottom intermediate node; and a first bottom coupling switch and a second bottom coupling switch configured to be controlled so as to couple, respectively, the first bottom intermediate node and the second bottom intermediate node to the first bottom input node and to the second bottom input node, respectively, and a bottom reading switch configured to be controlled so as to couple together the first bottom intermediate node and the second bottom intermediate node.

20. The PCM device of claim 19, further comprising:

a first additional switch arranged between the first top internal node and the second input of the bottom sense amplifier;

a second additional switch arranged between the second top internal node and the first input of the bottom sense amplifier;

a third additional switch arranged between the first bottom internal node and the second input of the top sense amplifier;

a fourth additional switch arranged between the second bottom internal node and the first input of the top sense amplifier; and a fifth additional switch arranged between the first top intermediate node and the second bottom intermediate node, wherein the controller is configured to operate in a first operating mode driving the first, second, third, and fourth additional switches so as to decouple the top sense amplifier and the bottom sense amplifier.

* * * * *